US006457173B1

(12) United States Patent
Gupta et al.

(10) Patent No.: US 6,457,173 B1
(45) Date of Patent: Sep. 24, 2002

(54) AUTOMATIC DESIGN OF VLIW INSTRUCTION FORMATS

(75) Inventors: Shail Aditya Gupta, Sunnyvale; B. Ramakrishna Rau, Los Altos; Richard C. Johnson, Sunnyvale; Michael S. Schlansker, Los Altos, all of CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/378,293

(22) Filed: Aug. 20, 1999

(51) Int. Cl.[7] .............................................. G06F 9/45
(52) U.S. Cl. ...................................................... 717/149
(58) Field of Search ................................ 717/149–161; 709/200–253; 712/23, 24, 205, 206, 214, 215, 216, 300

(56) References Cited

U.S. PATENT DOCUMENTS

| | | | | |
|---|---|---|---|---|
| 5,317,734 A | * | 5/1994 | Gupta | 709/106 |
| 5,596,732 A | * | 1/1997 | Hosoi | 717/155 |
| 5,669,001 A | * | 9/1997 | Moreno | 717/155 |
| 5,712,996 A | * | 1/1998 | Schepers | 717/151 |
| 5,721,854 A | * | 2/1998 | Ebcioglu et al. | 712/203 |
| 5,878,267 A | * | 3/1999 | Hampapuram et al. | 717/159 |
| 5,930,508 A | * | 7/1999 | Faraboschi et al. | 717/149 |
| 6,038,396 A | * | 3/2000 | Iwata et al. | 717/149 |
| 6,059,840 A | * | 5/2000 | Click Jr. | 717/161 |
| 6,301,706 B1 | * | 10/2001 | Maslennikov et al. | 717/150 |
| 6,367,067 B1 | * | 4/2002 | Odani et al. | 717/149 |

OTHER PUBLICATIONS

Petit et al. A New Processor Architecture Exploiting ILP With a Reduced Instructions Word. IEEE. 1998. 1–5.*
Tayyab et al. Management Of Heterogeneous Parallelism On Shared Memory Multiprocessors. IEEE. 1990. pp. 208–213.*
Glass. Compile–time Instruction Scheduling for Superscalar Processors. IEEE. 1990. pp. 630–633.*
Aditya et al., "Elcor's Machine Description System: Version 3.0," HPL–98–128, Oct. 1998, pp. 1–75.
Rau et al., "Machine–Description Driven Compilers for EPIC Processors," HP Laboratories Technical Report, HPL–98–40, Sep. 1998, pp. 1–82.
Kathail et al., "HPL PlayDoh Architecture Specification: Version 1.0," HP Laboratories Technical Report, HPL–93–80, Feb. 1994, pp. 1–48.
Rainer Leupers, Peter Marwedel, "Retargetable Generation of Code Selectors from HDL Processor Models," IEEE, 1997, pp. 140–144.
George Hadjiyiannis, Silvina Hanono, Srinivas Devadas, "ISDL: An Instruction Set Decription Language for Retargetability," ACM, 1997, pp. 299–302.
Gyllenhaal et al., "HMDES Version 2.0 Specification," Hewlett Packard Laboratories Technical Report IMPACT–96–3, (Published before Aug. 20, 1999).
Hadjiyiannis et al., "A Methodology for Accurate Performance Evaluation in Architecture Exploration." (Published before Aug. 20, 1999).
Hoogerbrugge et al., "Automatic Synthesis of Transport Triggered Processors." (Published before Aug. 20, 1999).

(List continued on next page.)

*Primary Examiner*—Kakali Chaki
*Assistant Examiner*—Wei Zhen

(57) ABSTRACT

A computer-implemented method automates the design of efficient binary instruction encodings of VLIW instruction formats. The method automatically finds compact instruction formats that can express and exploit the full parallelism specified in the underlying processor microarchitecture, subject to constraints on alignment and decode hardware complexity. The method can be guided by statistics about the composition and frequency of program instructions, so that the instruction format design is customized to a particular set of applications or an application domain.

20 Claims, 7 Drawing Sheets

OTHER PUBLICATIONS

Corporaal et al., "MOVE: A Framework for High–Performance Processor Design," ACM, 1991, pp. 692–701.

Corporaal et al., "Cosynthesis with the MOVE Framework." (Published before Aug. 20, 1999).

Lanneer et al, "Chapter 5—Chess: Retargetable Code Generation for Embedded DSP Processors," Code Generation for Embedded Processors, Kluwer Academic Publications, pp. 85–102. (Published before Aug. 20, 1999).

Fauth, "Chapter 8—Beyond Tool–Specific Machine Descriptions," Code Generation for Embedded Processors, Kluwer Academic Publications, pp. 138–152. (Published before Aug. 20, 1999).

Aditya et al., "Elcor's Machine Description System: Version 3.0," HPL–98–128, Oct. 1998, pp. 1–75.

Rau et al., "Machine–Description Driven Compilers for EPIC Processors," HP Laboratories Technical Report, HPL–98–40, Sep. 1998, pp. 1–82.

Kathail et al., "HPL PlayDoh Architecture Specification: Version 1.0," HP Laboratories Technical Report, HPL–93–80, Feb. 1994, pp. 1–48.

* cited by examiner

AUTOMATIC DESIGN OF VLIW INSTRUCTION FORMATS

TECHNICAL FIELD

The invention relates to programmable processors in general, and the automated design of instruction formats for Explicitly Parallel Instruction Computing (EPIC) Architectures. In this document, references to Very Long Instruction Word (VLIW) processors are meant to broadly encompass EPIC architectures.

BACKGROUND

As the workstation and personal computer markets are rapidly converging on a small number of similar architectures, the embedded systems market is enjoying an explosion of architectural diversity. This diversity is driven by widely-varying demands on processor performance and power consumption, and is propelled by the possibility of optimizing architectures for particular application domains. Designers of these application specific instruction-set processors (ASIPs) must make tradeoffs between cost, performance, and power consumption. In many instances, the demands for a particular application can be well served by using a very long instruction word (VLIW) architecture processor.

VLIW processors exploit instruction-level parallelism (ILP) by issuing several operations per instruction to multiple functional units. The processor's machine language provides the interface between hardware and software, while the instruction format specifies the precise syntax and binary encodings of all instructions in the machine language. A key step in processor design is the design of the instruction format. Compact instruction encodings reduce overall program size and improve instruction cache performance, but may require more costly instruction alignment and decode hardware. Simple encodings permit faster and less expensive alignment and decode hardware, possibly at the expense of increased program size. These tradeoffs between hardware complexity and code size can have a substantial impact on the overall system cost and performance. Unfortunately, designing the instruction encoding for a VLIW processor today is a fairly cumbersome manual process which must carefully weigh the above-mentioned cost and performance tradeoffs in the light of resource sharing and timing constraints of the given micro-architecture. Optimizations and customizations of the instruction encodings, if any, with respect to a set of applications or an application domain must also be determined and applied manually.

SUMMARY OF THE INVENTION

The invention provides a computer-implemented method for automatic design of efficient binary instruction encodings. The method automatically finds compact instruction formats that express and exploit the full parallelism specified in the underlying processor microarchitecture, subject to constraints on alignment and decode hardware complexity. Furthermore, the method can be guided by statistics about the composition and frequency of program instructions, so that the instruction format design is customized to a particular set of applications or an application domain.

This instruction format design method can be used in many different ways. It can be used as an assistant in the process of the manual design of general-purpose and application-specific processors, or for optimizing or customizing existing architectures to new application domains. It also enables automated design-space exploration of processor architectures by providing a much faster turnaround in designing and evaluating the cost and performance of instruction encodings for each point in the design-space.

The instruction format design process is implemented in a collection of program modules. These modules may be used individually or in a variety of combinations for unique instruction format design scenarios. In one such scenario, the design process takes an abstract Instruction Set Architecture (ISA) specification, a datapath specification, and optionally, custom instruction templates, and programmatically generates a specification of a bit allocation problem, which specifies the instruction fields for each template along with constraints and bit width requirements that control the allocation of bit positions to each field. In another scenario, the design process takes the bit allocation problem specification, and programmatically allocates bit positions to the instruction fields. These design scenarios may be combined to create a concrete ISA specification from the abstract ISA specification and the datapath programmatically.

In another scenario, the design process programmatically generates custom instruction templates based on operation issue statistics that indicate how a particular application program uses various processor operations. For example, a custom template selection module selects instruction templates that minimize certain cost functions, such as one that quantifies the code size. As alluded to above, the instruction design process can take a combination of custom templates and an abstract ISA specification and generate a concrete ISA specification. This approach may be used to generate a new concrete ISA specification or optimize an existing one.

In yet another scenario, the instruction format design process takes a concrete ISA specification and a list of instruction level parallelism constraints on specified processor operations, and programmatically generates an optimized concrete ISA specification. One unique aspect of this scenario is a program module that extracts an abstract ISA specification from the concrete ISA specification. This enables other program modules outlined above to take the combined ILP constraints and extracted abstract ISA specification and programmatically generate the bit allocation problem specification and allocate bit positions to each of the instruction fields.

Further advantages and features will become apparent with reference to the following detailed description and accompanying drawings.

DETAILED DESCRIPTION

Introduction

Figure 1:
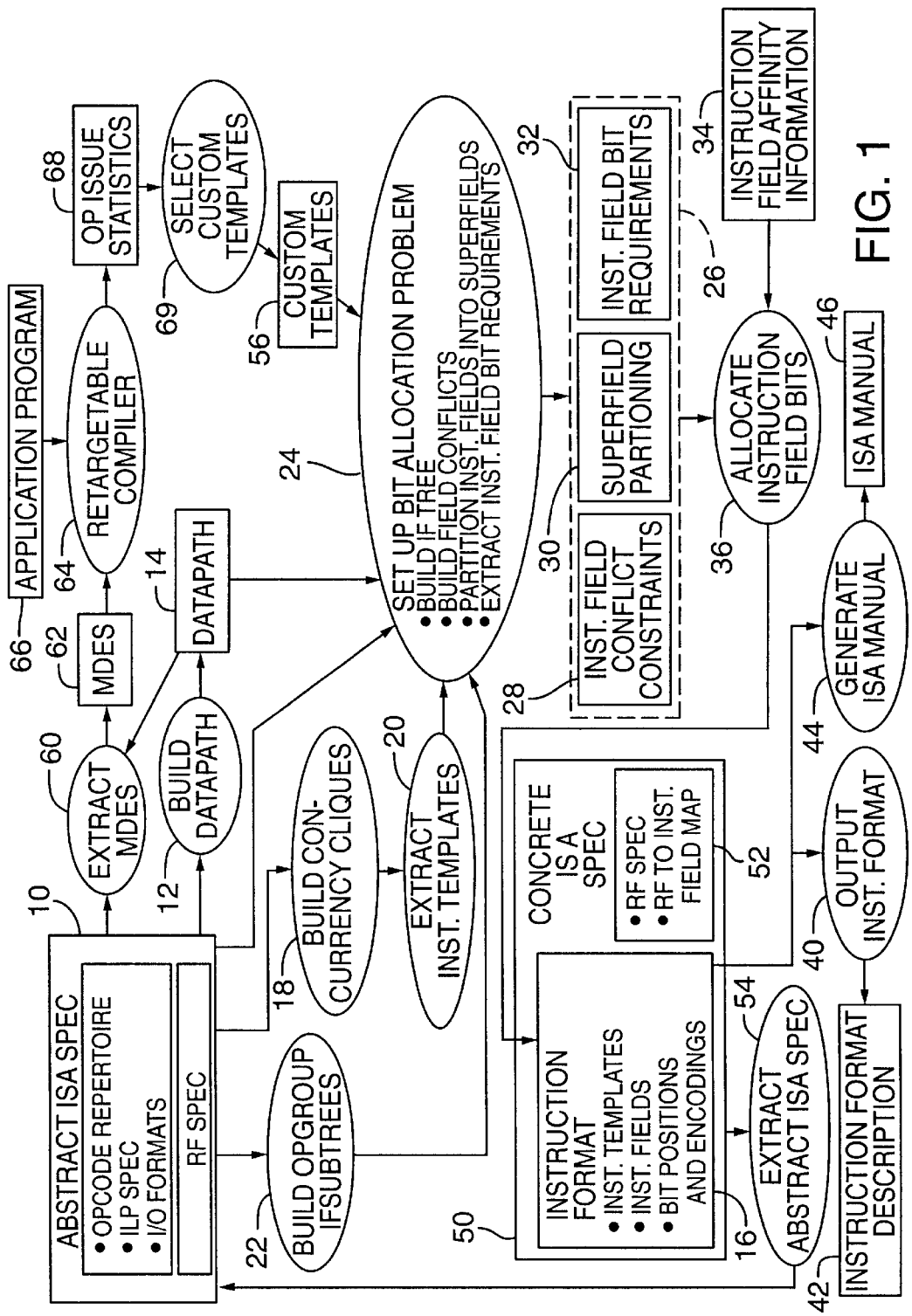
FIG. 1 is a diagram illustrating the instruction format design flow in an implementation of the invention.

FIG. 1 is a flow diagram illustrating the instruction format design flow in an automated processor design system. While this particular system is designed for the synthesis of a VLIW processor and its associated instructions, it also illustrates how a similar design system might be implemented for a single-issue processor. At a high level, the system takes a high-level processor architecture specification 10 as input, and automatically produces a complete hardware description of the target processor design, including a machine instruction set. The system is implemented in a series of program modules. FIG. 1 provides an overview of these modules, and the following description details an implementation of them.

The system illustrated in FIG. 1 is implemented in the C++ programming language. While the system may be ported to a variety of computer architectures, the current implementation executes on a PA-RISC workstation or server running under the HP-UX 10.20 operating system. The system and its components and functions are sometimes referred to as being "programmatic." The term "programmatic" refers to a process that is performed by a program implemented in software executed on a computer, in hardwired circuits, or a combination of software and hardware. In the current implementation, the programs as well as the input and output data structures are implemented in software stored on the workstation's memory system. The programs and data structures may be implemented using standard programming languages, and ported to a variety of computer systems having differing processor and memory architectures. In general, these memory architectures are referred to as computer readable media.

The high-level input specification 10 provides a desired set of machine operations together with an abstract specification of the concurrency and resource sharing constraints between them. A concurrency constraint identifies which operations are allowed to be executed at the same time, while a resource sharing constraint identifies which operations cannot be executed at the same time. To generalize these concepts, we refer to them as instruction-level parallelism (ILP) constraints. The ILP constraints may be specified (1) directly as sets of concurrent operations, (2) as a set of pair-wise exclusions between operations, or (3) as some combination of exclusions and concurrency sets. The ILP constraints specify the amount of instruction level parallelism within the processor directly in terms of which operations are allowed to execute in parallel and which ones may share a processor resource. The input specification may be entered by a user or generated by another program module.

The instruction format design is based in part on the design of the target processor's datapath. Before the instruction format design process begins, a datapath design process 12 generates the datapath design 14 from the input specification 10. The current implementation includes software components that automate the datapath synthesis process. The instruction format design then creates the instruction format based on the high level input 10 and the datapath specification. Finally, an automated control path design process synthesizes the processor's control path based on the instruction format and datapath designs. For additional information about the datapath and control path synthesis processes, see co-pending applications by Shail Aditya Gupta and Bantwal Ramakrishna Rau entitled, AUTOMATIC DESIGN OF PROCESSOR DATAPATHS and AUTOMATED DESIGN OF PROCESSOR INSTRUCTION UNITS, filed concurrently with this application, which are hereby incorporated by reference.

The datapath synthesis process allocates instances of various functional units (FUs) and register files from a macrocell database library (or libraries), along with the circuitry required to interface the FUs to the register files, which includes wires, busses, multiplexors, tri-state buffers, etc. Stored in a format called the Architecture Intermediate Representation (AIR), the datapath design is a machine-readable specification that includes the FU macrocell instances, the register file macrocell instances, and the interconnect component instances as well as a netlist specifying the connection among these components. The AIR of the datapath includes a set of related classes that specify the macrocell instances and interconnect information.

Based on the high level input 10 and datapath specification, the instruction format (iformat, for short) design process builds a data structure 16 representing the instruction format. The instruction format includes a specification of the different types of instructions supported in the processor, called instruction templates. In the implementation detailed below, the templates define variable-length instructions, but they can also represent fixed-length instructions.

Every instruction template is made up of concatenated instruction fields, which encode one or more operations, each including an opcode, source operand(s) and destination operand(s). In some processor designs, the fields may include additional bit specifiers that control the data path, such as multiplexor selector bits, and an instruction identifier (e.g., a template ID field that identifies the instruction). The iformat system associates the instruction fields with the underlying processor control ports and calculates their bit width requirements.

In addition to enumerating these fields, the instruction format assigns bit positions and encodings to each of them. The bit positions are specific positions that each field occupies in an instruction. The encodings are the binary values associated with the instruction fields. For example, an opcode field is associated with binary values that select a particular opcode.

In the process of designing the instruction format, the iformat system selects a set of templates based on the concurrency relationships from the input specification. Each template consists of one or more operations based on which operations are allowed to be issued in parallel (concurrently) in the architectural specification and which ones are specified to be mutually exclusive. As shown in step 18 in FIG. 1, the iformat system builds concurrency cliques from the ILP specified in the input specification. Each concurrency clique represents a set of mutually concurrent operation groups, such that one of the operations in each operation group in the set may be issued in parallel with one of the operation from each of the other operation groups. The system then extracts instruction templates from the concurrency cliques as shown in step 20.

For each of the operation groups, the iformat system extracts the inputs and outputs for each operation based on their I/O formats in the input specification and adds this information to the iformat data structure as shown in step 22. Using the extracted I/O formats, the iformat system enumerates the instruction fields for each of the operation groups associated with the templates.

Before allocating bit positions to each of the instruction fields, the iformat system sets up a Bit Allocation Problem (BAP) specification as shown in step 24 in FIG. 1. In this process, the iformat system uses the ILP constraints and datapath specification to generate the data structures in the BAP specification 26. The set-up process shown in FIG. 1 includes the following sub-steps: 1) building an instruction format (IF) tree; 2) determining instruction field conflict constraints; 3) partitioning instruction fields into superfields; and 4) extracting instruction field bit requirements from the datapath. The output of the process of setting up the BAP specification includes: 1) the instruction field conflict constraints 28; 2) a partitioning of the instruction fields into superfields 30; and 3) the bit width requirements 32.

The conflict constraints identify which fields are mutually exclusive and can be allocated overlapping bit positions and which fields need to be specified concurrently in an instruction and hence cannot overlap. Fields that are needed concurrently in an instruction are said to conflict with each other.

The set-up process 24 assigns instruction fields to control ports specified in the datapath. It then groups each set of instruction fields that map to the same control port into a superfield. These superfields enable the iformat design system to attempt to align these instruction fields at the same bit position in a process referred to as affinity allocation. The need for multiplexing is minimized if fields assigned to the same superfield are assigned to the same bit positions.

The process of partitioning instruction fields into superfields identifies fields that should preferably share bit positions. The iformat system enables a user or another program module to specify fields within a superfield that must share bits through an input data structure shown generally as instruction field affinity information 34 in FIG. 1.

The set-up process 24 extracts bit width requirements by traversing the fields and extracting the bit width requirements and encodings for each field from the datapath specification.

Once the instruction format syntax and instruction field bit width requirements have been determined, the system allocates bit positions to all fields as shown in step 36. Fields are allocated using a heuristic that allows non-conflicting fields to re-use bit positions, resulting in a shorter overall instruction size. Fields are also aligned based on affinity, i.e. fields associated with the same datapath resources are aligned to the same bit positions within the instruction register, resulting in reduced control complexity in hardware.

As shown in FIG. 1, the resulting instruction format includes instruction templates, instruction fields, and the bit positions and encodings of these fields. After bit allocation, the internal iformat data-structure 16 may be output in various forms for use by other modules of the overall processor design system. For example, one program module 40 generates an external file format 42, which is used to drive an assembler. Another module 44 generates a report in the form of an instruction set manual 46.

In some applications, the iformat system may be used to optimize an existing concrete ISA specification. In this scenario, an existing instruction format forms part of a concrete ISA specification 50, and the iformat system uses the concrete ISA along with custom templates to generate an optimized iformat programmatically. In addition to the iformat, the concrete ISA specification contains a register file specification 52, including register files, the number of registers in each file, and a correspondence between each operand instruction field type and a register file type. To optimize the iformat in a concrete ISA specification, the system begins by extracting an abstract ISA specification. As shown in FIG. 1, the system includes a module 54 for extracting an abstract ISA specification from the concrete ISA specification. The system then combines the extracted ISA specification with the additional ILP specification to create the input specification for the iformat design flow. The additional ILP specification provides a list of important concurrency sets and operation group occurrences. These concurrency sets represent statistically important subsets of the concurrency sets that are already present in the concrete ISA's instruction format. For example, this ILP specification may represent custom templates 56, which are generated by hand or programmatically. The output is an optimized instruction format, taking into account the additional ILP specification.

To the extent that the iformat design is based upon an application-specific architecture specification, it is application-specific but "schedule-neutral." The phrase "schedule-neutral" means that statistics detailing the usage of operations in an application program of interest have not been used to optimize the instruction format.

To optimize an iformat design for a particular application program, the iformat system selects custom templates from operation issue statistics obtained from scheduling the program. The iformat system then generates an iformat based on a combination of the custom templates and an abstract ISA specification.

The system uses a re-targetable compiler to generate the operation issues statistics for a particular processor design. As shown in FIG. 1, a module called the MDES extractor 60 generates a machine description in a format called MDES. For more information on the process of extracting a machine description used to re-target a compiler, see co-pending patent application by Shail Aditya Gupta entitled, PROGRAMMATIC SYNTHESIS OF A MACHINE DESCRIPTION FOR RETARGETING A COMPILER, filed concurrently with this application, which is hereby incorporated by reference.

This machine description retargets the compiler 64 to the processor design based on its abstract ISA specification 10 and datapath specification 14. The compiler 64 then schedules a given application program 66 and generates operation issue statistics 68 regarding the usage of the operation groups in the instruction format templates. The system then uses the frequency of use of the operations in each template by the application program to compute customized templates as shown in step 69. The customization process is automated in that it selects custom templates by minimizing a cost function that quantifies the static or dynamic code size and the decode cost (e.g., measured in chip area).

The process of selecting instruction templates in the iformat based on scheduling statistics may be conducted as a stand-alone process, or may be conducted in conjunction with the automated iformat design process. In the latter case, it may be used to provide an initial input specification of the desired ILP constraints to the automated iformat design process. Additionally, it may be used to optimize an existing iformat design.

The system may also perform additional optimization by using variable-length field encodings to further reduce the instruction size. These optimized designs can lead to dramatic reductions in code size, as shown in the detailed description below.

Abstract ISA Specification

To help clarify the nature of the input specification, we begin with definitions of the constructs used to define the input in the current implementation.

VLIW

VLIW refers to very long instruction word processors. In the context of this document, VLIW also refers more generally to an explicitly parallel instruction computing (EPIC) architecture that explicitly encodes multiple independent operations within each instruction.

Operation Set

An operation set is a set of opcodes that are mutually exclusive. The ability to represent opcodes in an operation set is only a convenience and is not required to implement the system. While each operation set can consist of a single opcode, it is more convenient to specify opcodes with similar properties as a set. This approach simplifies the input specification because the user (or another program module) need only specify desired concurrency and/or exclusion relationships among sets of operations, as opposed to each individual operation. Though not required, the opcodes in an operation set may share similar properties, such as latency and data type. For example, integer arithmetic operations such as ADD and SUBTRACT might be organized in an operation set. In the description that follows, we use the notation, ops ( ) to represent an operation set in textual form.

Operation Group

An operation group is an instance of an operation set. Operation groups make it possible to specify that multiple instances of the same operation be issued concurrently. For example, one may want a processor to be able to execute three integer ADD operations concurrently. Thus, the designer could specify that the input specification will include three operation groups, each representing an instance of the operation set, ops (ADD SUB).

Operation Group Occurrence

An operation group occurrence is an occurrence of an operation group in a particular concurrency set. The operation group occurrence enables the processor designer to identify concurrency relationships among operation groups explicitly in the input specification. For example, consider an operation group that is an instance of ops (ADD SUB). This operation group may be issued concurrently with many different combinations of operation groups. In order to specify these concurrency relationships, the input specification allows a different "occurrence" of the same operation group to be member of each of these concurrency sets.

Concurrency Set

A concurrency set is a set of operation group occurrences that may be issued concurrently.

Exclusion Set

An exclusion set is a set of Operation Group Occurrences that are mutually disjoint. In other words, the exclusion set specifies a set of operation groups, each having operations that cannot be executed concurrently with any of the operations in each of the other groups in the exclusion set. When specifying ILP constraints in terms of an exclusion set, the exclusion sets may be expressed as a set of operation groups or operation group occurrences.

Abstract Instruction Set Architecture Specification

An Abstract Instruction Set Architecture (ISA) Specification is an abstract specification of a processor design and may include the following:

- an opcode repertoire, possibly structured as operation sets;
- a specification of the I/O format for each opcode;
- a register file specification, including register files and specifying their types and the number of registers in each file;
- a specification of the desired ILP constraints, making use of some form of concurrency sets, exclusion sets or a combination of concurrency and exclusion sets, that specifies which sets of operation groups/opcodes can be issued concurrently; and
- other architecture parameters, e.g., presence/absence of predication, speculation, etc.

There are a variety of ways to represent the ILP constraints. The user (or another program module) may specify the desired ILP by specifying exclusion and concurrency relationships among operation group occurrences. One way to specify exclusion and concurrency relationships is to construct a data structure representing AND-OR relationships among operation group instances, such as a multi-level AND-OR tree. In such a structure, an AND relationship represents a concurrency relationship among operation group occurrences. Conversely, an OR relationship represents an exclusion relationship among operation group occurrences. Another way to specify exclusion and concurrency relationships is through a graph data structure where the nodes represent operation group occurrences, for example, and the edges connecting the nodes represent exclusion or concurrency relationships among the nodes. Yet another way is to specify pairwise exclusions between operation group occurrences.

ArchSpec

The ArchSpec is a textual, external file format for the Abstract ISA specification. The ArchSpec may be converted to an abstract ISA spec data structure, which is then processed further to synthesize a processor design. While the specific format of the ArchSpec is a textual file, it is not critical that the input be specified in this form. For example, the input could be specified via a graphical user interface and converted into an abstract ISA data structure.

Instruction Format Specification

The instruction format specifies the instructions capable of being executed in a VLIW processor design. These instructions are represented as instruction templates in the current implementation. The instruction format also includes the instruction fields within each template, and the bit positions and encodings for the instruction fields.

Concrete ISA Specification

The concrete ISA specification includes the instruction format specification and a register file specification of a processor design. A register file specification comprises register files, the number of registers in each file, and a correspondence between each operand instruction field type and a register file type.

Implementation of the Input Specification

The principal input of the iformat design process is an Abstract Instruction Set Architecture (ISA) specification 10. In the current implementation, the user or another program module may provide this specification as an ArchSpec in textual form. The ArchSpec provides an abstract description of a specific VLIW machine from a generic architecture family, such as the HPL-PD family of architectures. The architecture family specifies a superset of opcodes (e.g., the HPL-PD family instruction set), a set of logical register files to store various types of operands, and a specification of which logical files each opcode can source/sink its operands from - its (logical) operation format. The specification further specifies the semantics of important architectural mechanisms that may be included or excluded, such as predication, speculation, support for modulo-scheduling etc.

An ArchSpec reader module converts the textual form of the ArchSpec to an abstract ISA spec data structure, which contains a machine-readable set of tabular parameters and constraints, including register file entries, operation groups, and exclusion/concurrency relationships.

For convenience, the various instances of the opcodes for a given machine are grouped into Operation Groups (or opgroups), each of which is a set of opcode instances that are similar in nature in terms of their latency and connectivity to physical register files and are expected to be mutually exclusive with respect to operation issue. For example, since add and subtract operations require similar operand types and processing requirements, their respective opcode instances may be executed in the same ALU. By definition, all opcode instances within an operation group are mutually exclusive, while those across operation groups may be allowed to execute in parallel.

The parallelism of the machine may be further constrained by placing two or more operation groups into exclusion sets called Exclusion Groups, which makes all their opcode instances mutually exclusive and allows them to share resources. For instance, an exclusion group may include multiply and add operations that execute on separate functional units yet share the same result bus.

As an example, a simple 2-issue machine is specified below. The specification language is the database language HMDES Version 2 that organizes the information into a set of interrelated tables called sections containing rows of records called entries, each of which contain zero or more columns of property values called fields. See John C. Gyllenhaal, Wen-mei W. Hwu, and Bantwal Ramakrishna Rau. HMDES version 2.0 specification. Technical Report IMPACT-96-3, University of Illinois at Urbana-Champaign, 1996.

```
SECTION Operation_Group {
    OG_alu_0(ops(ADD SUB) format(OF_intarith2));
    OG_alu_1(ops(ADD SUB) format(OF_intarith2));
    OG_move_0(ops(MOVE) format(OF_intarith1));
    OG_move_1(ops(MOVE) format(OF_intarith1));
    OG_mult_0(ops(MPY) format(OF_intarith2));
    OG_shift_1(ops(SHL SHR) format(OF_intarith1));
}
SECTION Exclusion_Group {
    EG_0(opgroups(OG_alu_0 OG_move_0 OG_mult_
       0));
    EG_0(opgroups(OG_alu_1 OG_move_1 OG_shift_
       1));
}
```

This example specifies two ALU operation groups, two move operation groups, one multiply group, and one shift group. These operation groups are further classified into two exclusion groups denoting a two-issue machine. The multiply group shares resources with one ALU group while the shift group shares resources with the other. Each operation group also specifies one or more operation formats shared by all the opcodes within the group, which will be defined below. Additional operation properties such as latency and resource usage may also be specified, as shown below.

```
SECTION VLIW_Operation_Group {
    OG_alu_1(ops(ADD SUB) format("OF_intarith2")
       latency(OL_int)
       resv(RT_O_alu_1)
       alt_priority(0));
...}
```

The "resv" parameter provides an abstraction for specifying user-defined sharing. The "alt_priority" parameter provides information concerning the scheduling of operations by the system compiler. There is a similar set of parameters for each operation group.

The architecture specification additionally includes information to describe the physical register files of the machine and the desired connectivity of the operations to those files. A Register File entry defines a physical register file of the machine and identifies its width in bits, the registers it contains, and a virtual file specifier corresponding to the type of data (opcode operands) it is used to carry. The virtual specifier assumes an implied connectivity between the opcodes and the register file, e.g., a floating point opcode would need to connect to a floating point-type register file, etc. The register file entry may also specify additional properties such as whether or not the file supports speculative execution, whether or not the file supports rotating registers, and if so, how many rotating registers does it contain, and so on. The immediate literal field within the instruction format of an operation is also considered to be a (pseudo) register file consisting of a number of "literal registers" that have a fixed value.

The Operation Format (IO Formats) entries specify the set of choices for source/sink locations for the various operations in an operation group. Each operation format consists of a list of Field Types (IO Sets) that determine the set of physical register file choices for a particular operand. For predicated operations a separate predicate input field type is also specified.

An example of the register file and operation format sections of an architecture specification are shown below:

```
SECTION Register_File {
    gpr(width(32) regs(r0 r1 ... r31) virtual(I));
    pr(width(1) regs(p0 p1 ... p15) virtual(P));
    lit(width(16) intrange(-32768 32767) virtual(L));
}
SECTION Field_Type {
    FT_I(regfile(gpr));
    FT_P)regfile (pr));
    FT_L(regfile(lit));
    FT_IL(compatible_with(FT_I FT_L));
}
SECTION Operation_Format {
    OF_intarith1(pred(FT_P) src(FT_I) dest(FT_I));
    OF_intarith2(pred(FT_P) src(FT_IL FT_I) dest(FT_
       I));
}
```

The example shows that the above machine has a 32-bit general purpose register file "gpr", a 1-bit predicate register file "pr" and a 16-bit literal (pseudo) register file "lit". Each register file can be used alone or in conjunction with other files in a field type specification as a source or sink of an operand. Field types for the predicate, source and destination operands are combined to form the valid operation formats for each operation group. For example, the 2-input ALU operation group "OG_alu0" (See "SECTION Operation_Group" above) has an operation format "OF_intarith2" which specifies that its predicate comes from the register file "pr", its left input could be a literal or come from the register file "gpr", and its right input and output come from the register file "gpr".

The specification may also contain information concerning specific architecture parameters:

```
SECTION Architecture_Flag {
    predication_hw(intvalue(1));
    speculation_hw(intvalue(0));
    systolic_hw(intvalue(1));
    technology_scale(doublevalue(0.35));
}
```

This section comprises a set of processor parameters, and includes information concerning predication, speculation, and whether the design is to support a systolic coprocessor. A technology scale factor, which pertains to a manufacturing level (e.g., 0.35 micron), may also be provided. This technology scale factor can be used to calculate the area of silicon required to manufacture each processor.

Instruction Syntax

VLIW processors issue instructions having multiple instruction fields. An instruction field is a set of bit positions intended to be interpreted as an atomic unit within some instruction context. Familiar examples are opcode fields, source and destination register specifier fields, and literal fields. Bits from each of these fields flow from the instruction register to control ports in the data path. For example, opcode bits flow to functional units, and source register bits flow to register file read address ports. Another common type of instruction field is a select field. Select fields encode a choice between disjoint alternatives and communicate this context to the decoder. For example, a select bit may indicate whether an operand field is to be interpreted as a register specifier or as a short literal value.

An operation is the smallest unit of execution; it comprises an opcode, source operands, and destination operands. Each operand may support one or more operand types. A set of possible operand types is called an io-set. A list of io-sets, one per operand, form an operation's io-format. For example, suppose an add operation permits its left source operand to be either an integer register or a short literal value, and suppose its right source and destination operands source and sink from integer registers. The corresponding io-sets are {gpr, s}, {gpr}, {gpr}. The io-format is simply this list of io-sets, which are abbreviated in shorthand notation as follows:

gpr s, gpr : gpr

Closely related operations such as add and subtract often have the same io-format. One reason for this is that related operations may be implemented by a single, multi-function unit (macro-cell). As discussed above, to simplify the instruction format design process, related operations are grouped into operation groups.

The instruction format assigns sets of op groups (called super groups) to slots of an instruction. The processor issues operations within an instruction from these slots concurrently. To fully specify an operation, the instruction format specifies both an op-group and an opcode (specific to that opgroup). In effect, this organization factors a flat opcode name space into a multi-tier encoding. In rare cases, this factorization may increase the encoding length by one bit per level. However, it should be noted that this approach does not preclude a flat encoding space: placing each operation in its own op-group eliminates the factorization. More importantly, hierarchical encoding often gives the same benefits as variable-length field encoding, but is simpler to implement.

The Instruction Format Tree

In a flat, horizontal instruction format, all instruction fields are encoded in disjoint positions within a single, wide instruction. A hierarchical instruction format allows exclusive instruction fields (those that are not used simultaneously in any instruction) to be encoded in overlapping bit positions, thereby reducing the overall instruction width. In the instruction format design system shown in FIG. 1, the hierarchical relationship between instruction fields is represented by an instruction format tree (if-tree). The leaves of an if-tree are instruction fields; where each leaf points to a control port in the data path, such as a register file address port, or an opcode input of a FU.

Figure 2:
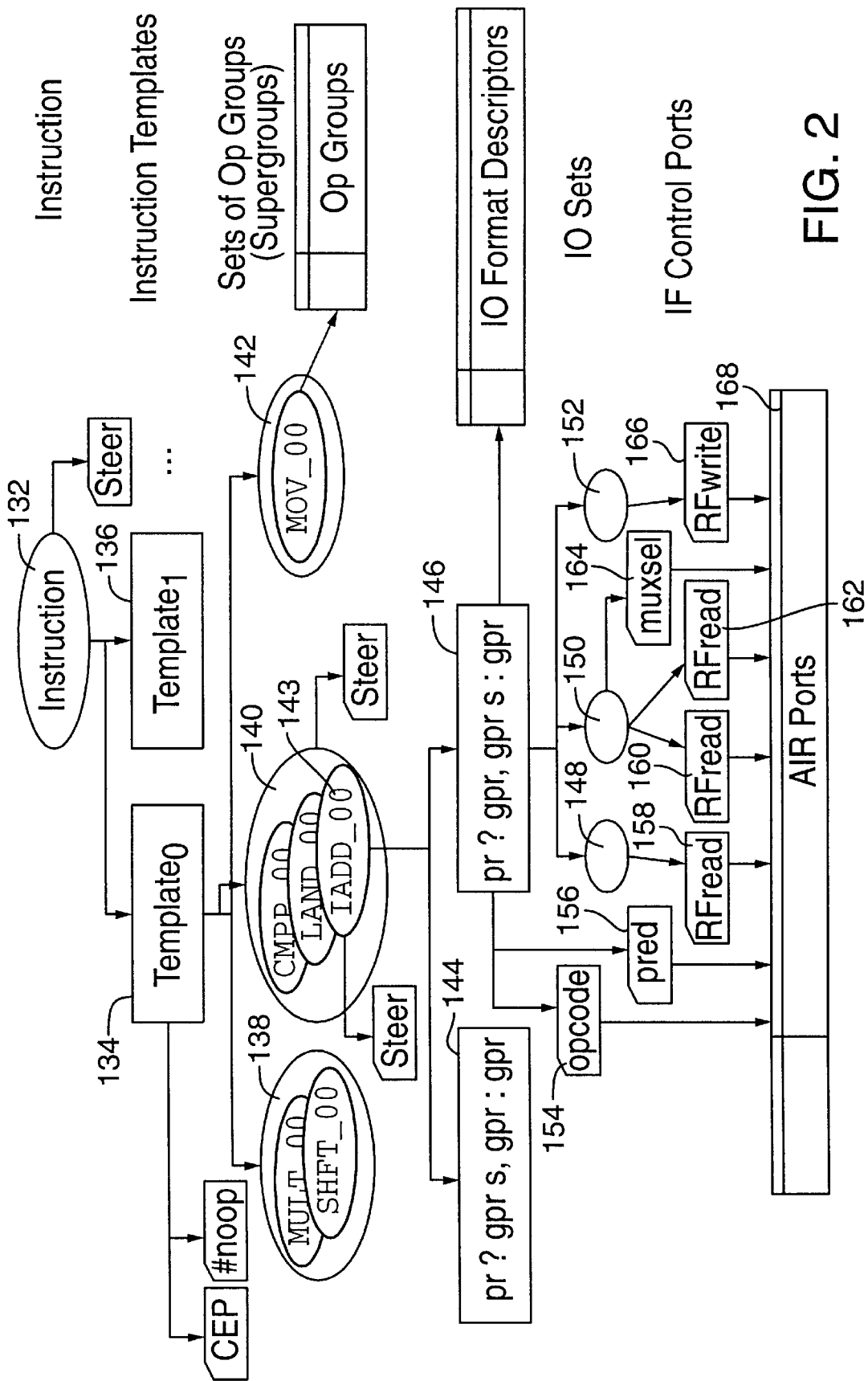
FIG. 2 is a diagram of an instruction format data structure.

FIG. 2 illustrates the structure of an if-tree used in the current implementation. The overall structure of the tree defines how each instruction is built. Each part of the tree represents a node, with the lowest nodes (the cut-off-box-shaped nodes) forming the tree's leaves. The oval-shaped nodes are "OR" nodes, while the boxed-shaped nodes are "AND" nodes. The OR nodes denote a selection between the children of the node such that only one choice (one branch) extends to the next level. Conversely, an AND node allows all of the components of the node to form new branches. Stated another way, each level of the tree is either a conjunction (AND) or disjunction (OR) of the subtrees at the lower level.

The root node 132 of the tree is the overall machine instruction. This is an OR node representing a choice of instruction templates. A template select field (template ID) is used to identify the particular template. This select field is illustrated as the leaf node labeled "steer" connected to the instruction node 132.

Individual instructions are based on instruction templates, which are the AND-type child nodes of the root node (See, e.g., templates 134 and 136). The templates each encode the sets of operations that issue concurrently. Since the number of combinations of operations that may issue concurrently is astronomical, it is necessary to impose some structure on the encoding within each template. Hence, each template is partitioned into one or more operation issue slots. Every combination of operations assigned to these slots may be issued concurrently.

In addition, each template has a consume to end-of-packet bit field (CEP) that indicates whether the next instruction directly follows the current instruction or it starts at the next packet boundary. This capability is used to align certain instructions (e.g. branch targets) to known address boundaries. Each template also specifies the number of spare bits that may be used to encode the number of no-op cycle to follow the current instruction. These spare bits may arise due to a need for packet alignment or quantized allocation.

The next level of the tree defines each of the concurrent issue slots. Each slot is an OR node supporting a set of operation groups, called a super group (i.e., nodes 138, 140, 142), that are all mutually exclusive and have the same concurrency pattern. A select field chooses among the various operation groups within a super group. Again, this select field is illustrated as the leaf node labeled "steer" connected to super group 140.

Below each super group lie operation groups as defined in the input specification as described above. Each operation group (e.g., operation group 143) is an OR node that has a select field ("steer") to choose among the various operation formats supported by operation group. FIG. 2 shows this situation where one operation format allows a literal field on the left port, while the other allows it on the right port.

Each operation format (e.g., IO format descriptors 144, 146) is an AND node consisting of the opcode field 54, the predicate field (if any) 156, and a sequence of source and destination field types (shown as IO sets 148, 150, 152). The traditional three-address operation encoding is defined at this level.

Each IO set is an OR node consisting of a singleton or a set of instruction fields that identify the exact kind and location of the operand. IO sets with multiple choices (e.g., 150) have a select field to identify which instruction field is intended. For example, one of the IO set nodes 150 represents a selection between instruction fields 160, 162, which is controlled via a multiplexor select field 164. The other IO sets each have only one kind of field, and thus, have a single child node representing that field (nodes 158, 166). The instruction fields point to the datapath control ports 168.

In implementing an instruction format, one principal design choice is whether to use a single, fixed-length instruction format, or allow variable-length instructions. The iformat design system supports both fixed and variable length instructions. The use of variable-length instructions produces more-compact code but increases decode complexity. The trade-off between code size and instruction decode complexity is a primary design consideration. A single, fixed-length instruction format simplifies decode logic and the data path for dispersal of operations to functional units, but it often results in poor code density, since the single format must accommodate the worst-case (longest) instruction. For example, if the longest instruction in a fixed-length instruction format is 128 bits long, then all of the instructions in the instruction set must be 128 bits long. In order to maintain a constant instruction length, many instructions will require the use of wasted bits whose sole purpose is to fill in unused space in the instructions. These wasted bits lead to increased code size. Conversely, variable-length instructions can accommodate both wide and compact, restricted instruction formats without wasting bits, which results in a reduction in code size. By using variable-length instructions, the instruction format can accommodate the widest instructions where necessary, and make use of compact, restricted instruction formats, such as instructions that do not encode long literals.

Figure 3:
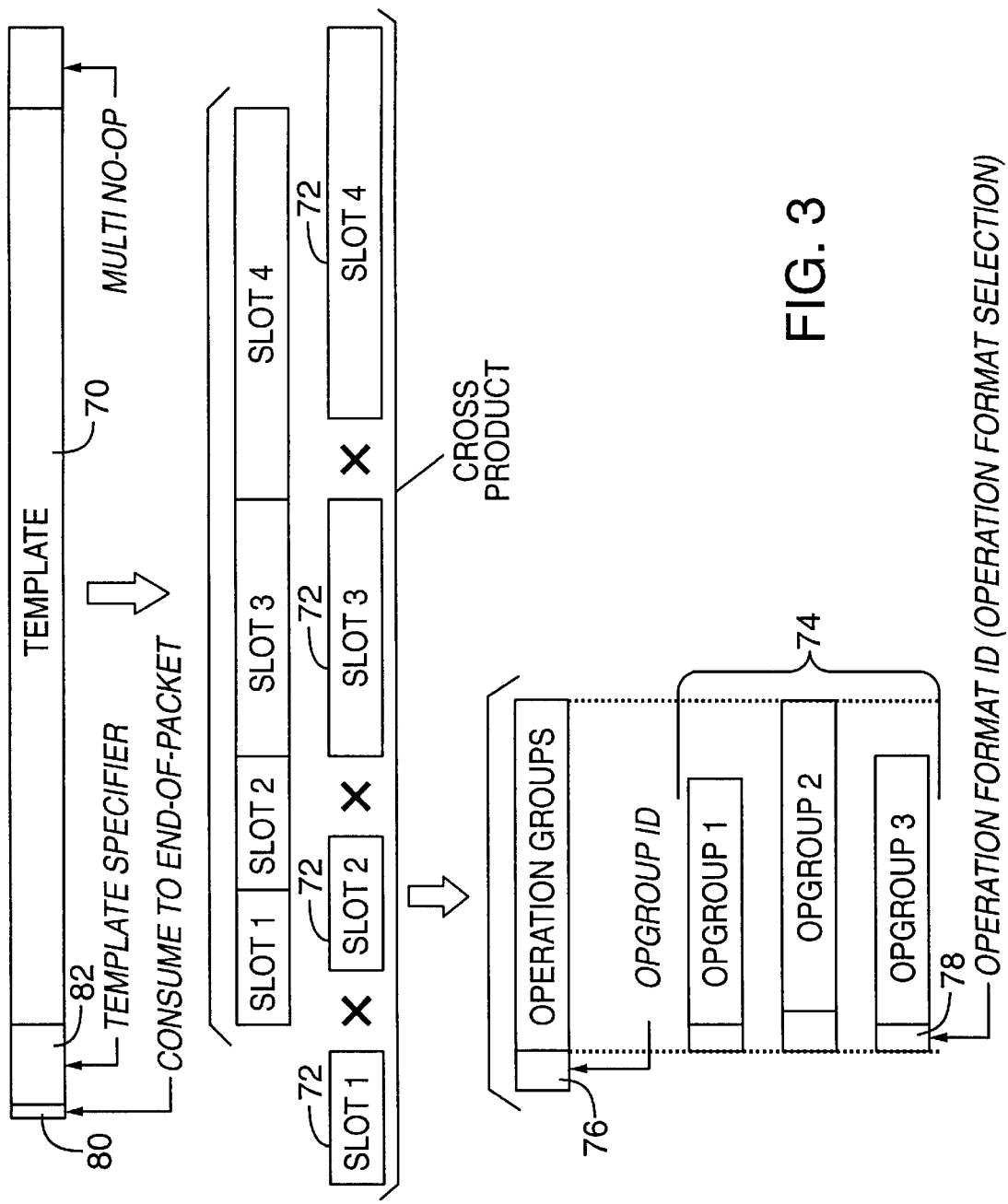
FIG. 3 is a diagram illustrating an example of an instruction template, which represents a possible VLIW instruction format.

FIG. 3 shows the format of an instruction and its building blocks. At the heart of the instruction is an instruction template 70. An instruction template encodes sets of operations that issue concurrently. Each template includes multiple concurrent slots 72, where each slot comprises a set of exclusive operation groups 74. Since all of the operations in an operation group are exclusive, all of the operations in each slot are also exclusive. Each template encodes the cross-product of the operations in each of its slots.

The length of each template is variable, depending in part on the length and number of the slots in the template. For example, some templates might have two slots, while other templates might have three or four slots. Furthermore, the width of each slot will depend on the width of the widest operation group within that slot, plus overhead, as shown in the lower portion of FIG. 3. There is considerable similarity and overlap among the opcodes within an operation group by construction, so very little encoding space is wasted within the operation group. But the opcode field now must be split into an operation group selection field 76 and an opcode selection field 78 within the operation group. With logarithmic encoding, this requires at most one additional bit for encoding the opcode. For example, 15 opcodes may be encoded in 4 bits, while splitting them into 3 operation groups of 5 opcodes each requires $[\log_2(3)]+[\log_2(5)]=5$ bits. In addition, every slot has a reserved no-op encoding.

In cases where an op group has alternative operation formats, there is yet another select field to select the operation format.

Each instruction also includes a consume to end-of-packet bit 80, and a template specifier 82. The template specifier identifies the template. An instruction format having t templates will need $[\log_2(t)]$ bits to encode the template specifier. This template specifier is in a fixed position within every instruction, and from its value, the instruction sequencer in the processor's control path determines the overall instruction length, and thus the address of the subsequent instruction.

In the current implementation, the length of the instruction is variable, but each length is a multiple of a predetermined number of bits called a quantum. For instance, if the quantum is 8 bits, the length of the instruction could be any number equal to or above some minimum value (say 32 bits) that is divisible by 8, such as 64 bits, 72 bits, 80 bits, etc. One or more dummy bits may be placed as appropriate within the instruction to ensure that the length of the instruction falls on a quantum boundary.

The iformat system builds the levels of the if-tree in an incremental fashion. It constructs the top three levels, consisting of the instruction, the templates, and the super groups from the abstract ISA specification, and optionally, custom templates. It constructs the middle layers, including the operation groups, the operation formats, and the field types from the abstract ISA specification. Finally, it constructs the instruction fields from the contents of the various field types in the abstract ISA specification and the individual control ports in the datapath that each field is supposed to control.

Instruction Templates

A primary objective of the instruction format design system is to produce a set of instruction templates that support the encoding of all of the sets of operation groups that can be issued concurrently. To initiate the template design process, the instruction format design system starts out with the architecture specification, which defines the exclusion and concurrency constraints for a particular design. In one implementation, the architecture specification directly provides the exclusion relationships between operation groups. However, the iformat design process needs to know which opcodes can be issued concurrently, i.e., the concurrency relationship, rather than which opcodes must be exclusive.

In such an implementation, the concurrency relationship is taken to be the complement of the exclusion relationship. One way of determining the concurrency relation is to take the complement of the exclusion relations among opcodes implied by the architecture specification and treat each set of concurrent opcodes as a potential candidate for becoming an instruction template. While this provides an excellent starting point, it unfortunately does not lead to a practical solution, since the number of combinations of operations that may issue concurrently quickly becomes intractable. For example, a typical VLIW machine specification may include 2 integer ALUs, 1 floating point ALU and 1 memory unit, with 50 opcodes each. In such a machine the total number of distinct 4-issue instructions is $50^2 \times 50 \times 50 = 6,250,000$. Specializing instructions to 1, 2, and 3-issue templates would add many more. It is therefore necessary to impose some structure on the encoding within each template.

Our current implementation uses several mechanisms to reduce the complexity of the problem. These mechanisms represent iformat design decisions and affect the final instruction format layout and size. In most cases there may also be a tradeoff between the simplicity and orthogonality of the field layout (and hence the decode hardware) and the size of the instruction template. These tradeoffs will be described as the design process is detailed below.

As a first axiom, all templates must satisfy an exclusion constraint between two opcodes, i.e. these opcodes must never occupy separate slots in any template. This is because these opcodes may share hardware resources during execution, and therefore, the scheduler should never put these opcodes together within the same instruction. On the other hand, a concurrency constraint between two opcodes implies that the scheduler is free to issue these opcodes together in a single instruction and therefore there should be some template in which these two opcodes are allowed to occur together. In particular, that template may contain additional slots that can be filled with noops, if necessary. Therefore, it is unnecessary to generate a special template for each concurrency constraint, but rather all that is needed is a set of templates that can effectively cover all possible sets of concurrently scheduled opcodes.

The problem becomes greatly simplified when the concurrency of operation groups is considered instead of individual opcodes. As introduced above, operation groups are defined as sets of opcode instances that are generally similar in nature in terms of their latency and connectivity to physical register files and are expected to be mutually exclusive with respect to operation issue. All opcodes within an operation group must be mutually exclusive by definition. Furthermore, the instruction format is designed so that all opcodes within an operation group share the same instruction fields. Thus, the operation group is an obvious choice for the primary building block for creating templates.

Figure 4:
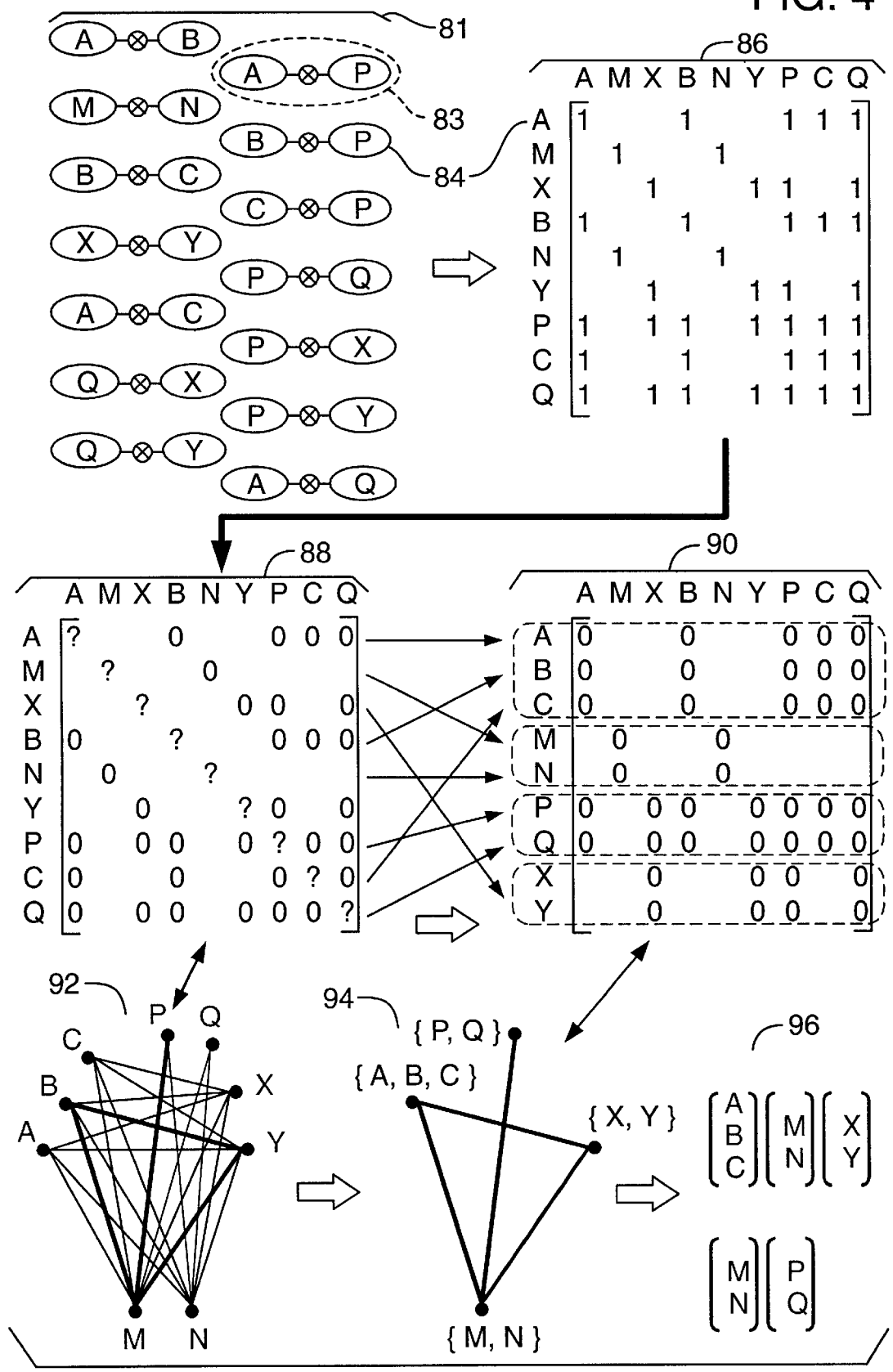
FIG. 4 shows an example illustrating how the instruction format design system uses the ILP constraints on operations to build a concurrency matrix data structure and then select instruction templates based on the concurrency relationships expressed in the data structure.

Another simplification involves classifying mutually-exclusive operation groups into equivalence classes called super groups based on the constraints provided in the architecture specification. FIG. 4 illustrates an example that shows how the operation groups (shown as letters) and exclusion relations are used in the template selection process. The process starts with the ILP constraints 81, which define a set of exclusion relationships 83 between operation groups 84. From these exclusion relationships, the iformat design system builds a boolean exclusion matrix 86. In the exclusion matrix 86, the rows and columns are matched up with respective operation groups, e.g., "A" corresponds to the operation group A, "B" corresponds to the operation group B, etc. The 1's in the matrix indicate an exclusion relationship, while a blank indicates that the corresponding operation groups may be issued concurrently. (The blanks are actually 0's in the real matrix—blanks are used here for clarity). The system then builds a concurrency matrix 88 from the exclusion matrix 86. The concurrency matrix 88 is the complement of the exclusion matrix 86. The "?"s along the diagonal of the concurrency matrix 88 can be interpreted as either a 1 or 0.

The rows in the concurrency matrix determine a set of concurrency neighbors for each operation group. A graphical representation of the relationships defined by the concurrency matrix 88 is shown in concurrency graph 92. Each node represents an operation group, while each connecting "edge" represents a concurrency relation. A clique is a set of nodes from a graph where every pair of nodes is connected by an edge. For instance, there are 16 cliques in the concurrency graph 92.

After the concurrency matrix is generated, the system compares the rows in the concurrency matrix to identify equivalent operation groups. The super groups are formed from the equivalent operation groups. Two operation groups are said to be equivalent if they have the same set of concurrency neighbors. Note that two mutually exclusive operation groups that have the same set of concurrency neighbors can replace each other in any template without violating any exclusion constraint and therefore can be treated equivalently. Similarly, two concurrent operation groups that have the same set of concurrency neighbors (other than themselves) can always be placed together in a template without violating any exclusion constraints and therefore can be treated equivalently.

An example of pseudocode for performing equivalence checking and partitioning into super groups is illustrated below.

```
ProcedureFindSuperGroups(BitMatrix concur)
  1: //"concur" is a (numNodes×numNodes) boolean matrix
  2: //First, initialize supergroup hash table and id counter
  3: HashMap;BitVector, int? SGmap
  4: Int Sgcount=0;
  5: for (i=0 to numNodes−1) do
  6:   //extract each node's vector of neighbors w/ and w/o
        self
  7:   BitVector AND-group=concur.row(i) .set_bit(i);
  8:   BitVector OR-group=concur.row(i) .reset_bit(i);
  9:   //Check for existing AND-style supergroup for this
        node
 10:   if (SGmap(AND-group) is already bound) then
 11:     SGkind(i)=SG-AND;
 12:     SGid(i)=SGmap(AND-group);
 13:   //Check for existing OR-style supergroup for this node
 14:   else if (SGmap(OR-group) is already bound) then
 15:     SGkind(i)=SG-OR
 16:     SGid(i)=SGmap(OR-group);
 17:   //If neither neighbor relation is present, start a new
 18:   //supergroup with the new neighbor relations
 19:   else
 20:     SGid(i)=SGcount;
 21:     SGmap(AND-group)=SGmap(OR-group)=SGcount;
 22:     SGcount=SGcount+1;
 23:   endif
 24: endfor
```

The equivalence check and the partitioning can be performed quickly by employing the pigeon-hole principle. The algorithm hashes each operation group using its set of neighbors in the concurrency matrix as the key. The neighbor relations (neighbor keys) for each operation group (each row) are converted to bitvectors. The algorithm hashes in two ways: once by treating each operation group as concurrent with itself (AND-style) thereby finding equivalent concurrent operation groups, and the second time by treating each operation group as exclusive with itself (OR-style) thereby finding equivalent exclusive operation groups. This hashing approach results in two bitvectors for each operation group—one with the "?" entry changed to a 1 (AND-style), and one with the "?" entry changed to a 0 (OR-style).

Bitvectors (operation groups) that hash to the same bucket necessarily have the same concurrency neighbors and therefore become part of the same super group. For example in FIG. 4, operation groups A, B, and C have the same concurrency neighbors and thus form the super group {A, B, C}. The other super groups, {P, Q}, {X, Y}, and {M, N}, are similarly formed. The set of all distinct super groups is defined by all the distinct neighbor keys. This partitioning leads to a reduced-concurrency (super group) graph 94, comprising the super groups and their concurrency relations. Instruction templates 96 are obtained from the reduced concurrency graph, as described below.

Each operation group identifies whether it is an AND-type or OR-type super group. This information is used in the final template expansion, where each operation group from an AND-type super group is given a separate slot, while all operation groups from an OR-type super group are put into the same slot.

In the concurrency matrix 90 shown in FIG. 4, the "?" entries of the "A", "B", and "C" operation group bitvectors have been changed to 0's so that their corresponding bitvectors are identical. Thus, "A", "B", and "C" form an OR-type super group {A, B, C}, and each operation group is placed in the same slot.

Figure 5:
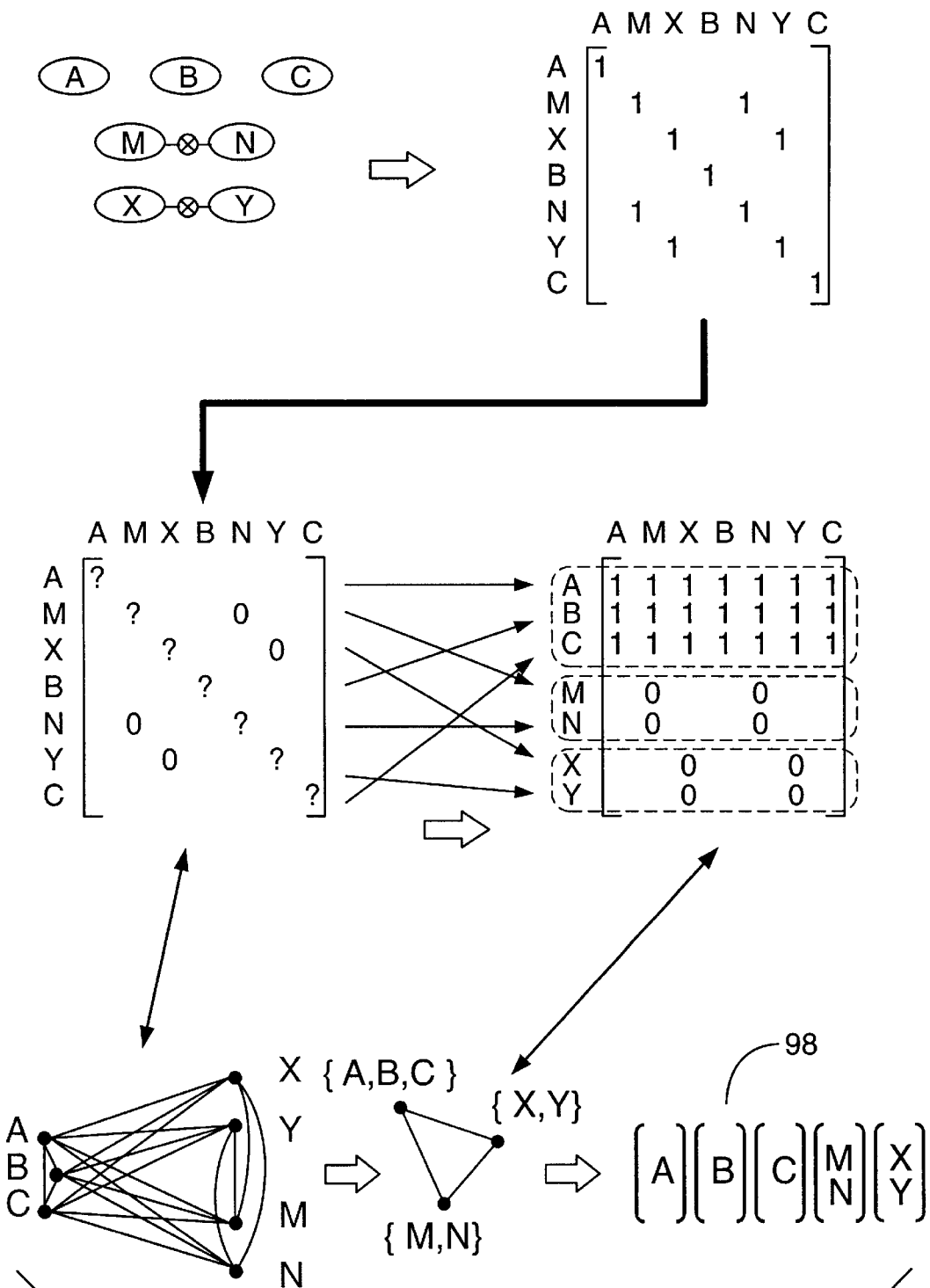
FIG. 5 is a diagram illustrating another example of how the instruction format design system uses ILP constraints specified in the input to organize the operations into VLIW instruction templates.

FIG. 5 shows a case with an AND-type and an OR-type super group. In order to obtain identical bitvectors, the "A", "B", and "C" operation groups are treated as being concurrent with themselves. As a result, they form an AND-type super group and are placed in separate template slots. In contrast, the "M", "N", "X", and "Y" operation groups are treated as exclusive with themselves and form two different sets of OR-type super groups {M,N} and {X,Y}, which each occupy a single slot.

For a homogenous VLIW-style machine with multiple, orthogonal functional units this process yields tremendous savings by reducing the complexity of the problem to just a few independent super groups. The resulting instruction templates closely match super groups to independent issue slots for each functional unit. For a more heterogeneous machine with shared resources, the resulting number of templates may be larger and the decoding is more complex but partitioning the operation groups into super groups still reduces the complexity of the problem significantly.

Concurrency Cliques and Templates

Once the super groups have been determined, each clique in the reduced concurrency graph is a candidate for an instruction template since it denotes a set of super groups that may be issued in parallel by the scheduler. A clique is a subgraph in which every node is a neighbor of every other node. Clearly, enumerating all cliques would lead to a large number of templates. On the other hand, unless the concurrency among super groups is restricted in some other way, it is necessary to choose a set of templates that cover all possible cliques of the super group graph to ensure that the scheduler is not restricted in any way other than that specified in the ArchSpec.

As an example, suppose super groups A, B and C only have pairwise concurrency constraints, i.e., {AB}, {AC}, and {BC}. These pairwise concurrencies can be covered in one of two ways. First, the pairwise concurrency constraints can be treated as three independent templates AB, AC, and BC, each requiring two issue slots. A second possibility is to treat the pairwise concurrencies as being simultaneously concurrent, thereby requiring only one template (ABC) with three issue slots. Strictly speaking, this allows more parallelism than what was intended. If the compiler never scheduled all three operations simultaneously, the second design would end up carrying one noop in every instruction thereby wasting one-third of the program space. On the other hand, the first design requires additional decoding logic to select among the three templates and more complex dispersal of the instruction bits to the various functional units.

In the present scheme, this tradeoff is made towards initially choosing a reduced number of possibly longer templates. This is partly due to the fact that the ArchSpec does not directly specify concurrency in most instances, but rather specifies exclusion relations among operation groups that are then complemented to obtain concurrency relations. During the initial template design phase, choosing the maximally concurrent templates covers all possible concurrency relations with as few templates as possible.

Figure 6:
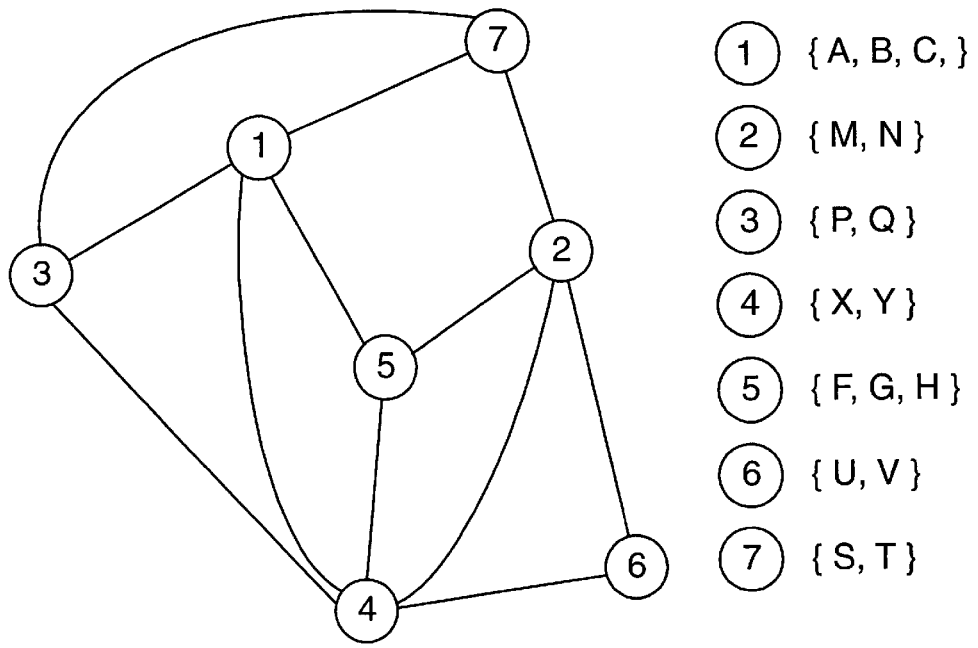
FIG. 6 is a diagram illustrating the process of selecting instruction templates.
Figure 6:
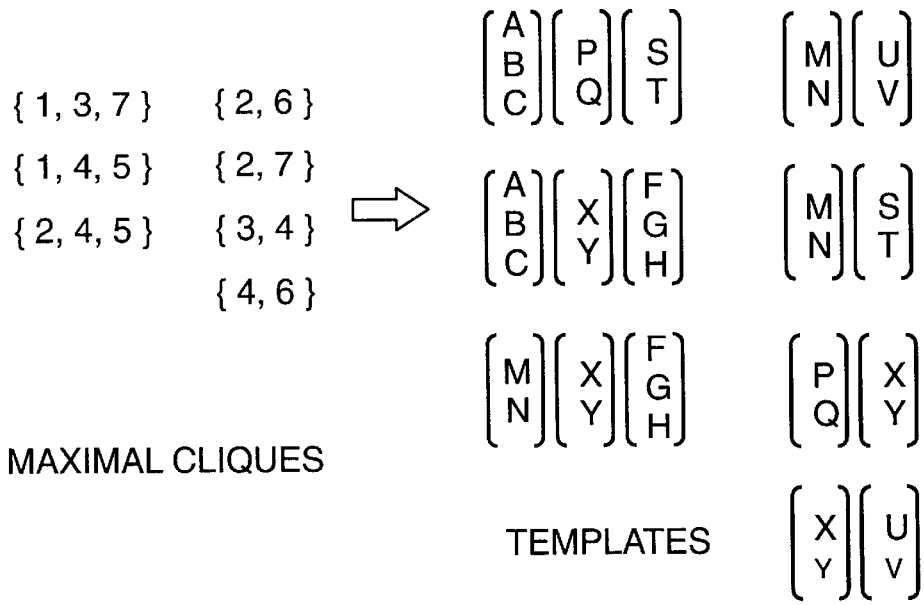

The maximally concurrent templates may be determined by finding the cliques of the super group graph. An example of a simple reduced super group concurrency graph is shown in FIG. 6. The graph comprises super groups 1–7, and their interconnecting edges. The maximal cliques for such a simple graph can be determined by hand by simply identifying sets of nodes that are completely connected—that is each node in a clique must connect to the remaining nodes in the clique. For instance, {1, 3, 7} is a clique, while {2, 4, 5, 6} is not (nodes 5 and 6 are not connected). In the supergraph of FIG. 6, there are seven maximal cliques, and thus seven maximally concurrent templates.

It is necessary to use computational means to calculate the cliques for more complex super group graphs. Finding all cliques of a graph is a well-known NP-complete problem. Therefore, we use an algorithm that uses well-known heuristics to enumerate them. An algorithm for finding all the maximal cliques in a graph is as follows:

RecursiveFindCliques(currentClique, candidateNodes)
 1: // Check if any candidate remains
 2: if (candidateNodes is empty) then
 3: // Check if the current set of clique nodes is maximal
 4: if (currentClique is maximal) then
 5: Record(currentClique);
 6: endif
 7: else
 8: StartNodes=Copy(candidateNodes);
 9: while (StartNodes is not empty) do
 10: H1: if (currentClique ∪ candidateNodes ⊆ some previous Clique) break
 11: node=pop(StartNodes);
 12: candidateNodes=candidateNodes-[nodes];
 13: if (currentClique ∪ {node} is not complete) continue;
 14: H2: prunedNodes=candidateNodes ∩ NeighborsOf(node);
 15: RecursiveFindCliques(currentClique ∪ {node}, prunedNodes);
 16: H3: if (candidateNodes) ⊆ NeighborsOf(node)break;
 17: H4: if (this is first iteration) startNodes=startNodes-neighborsOf(node);
 16: endwhile
 17: endif The algorithm recursively finds all cliques of the graph starting from an initially empty current clique by adding one node at a time to it. The nodes are drawn from a pool of candidate nodes which initially contains all nodes of the graph. The terminating condition of the recursion (line 2) checks to see if the candidate set is empty. If so, the current clique is recorded if it is maximal (line 4), i.e. there is no other node in the graph that can be added to the current clique without severing the completeness of the clique.

If the candidate set is not empty, then we need to grow the current clique with the various candidates. An exponential search is performed at this point. Various heuristics have been published for growing the maximal cliques quickly and to avoid examining sub-maximal and previously examined cliques repeatedly. The first heuristic (H1) checks to see whether the current clique and the candidate set is a subset of some previously generated clique. If so, the current procedure call cannot produce any new cliques and is pruned. Otherwise, the method continues to grow the current clique with the candidates one by one.

Each candidate node is processed for inclusion into the current clique as follows. If the selected candidate forms a complete graph with the current clique (line 13), it is added to the current clique and the procedure is called recursively with the remaining candidates (line 15). The second heuristic (H2) is to restrict the set of remaining candidates in the recursive call to just the neighbors of the current node since any other node will always fail the completeness test within the recursive call. After the recursive call returns, if the remaining candidate nodes are found to be all neighbors of the current node, then we can also prune the remaining iterations within the current call (H3) since any maximal clique involving any of those neighbors must include the current node and all such cliques were already considered in the recursive call. Finally, if non-neighboring candidates are present, we can still drop the neighbors of the current node as starting points for the first iteration only (H4).

Set-Up of Bit Allocation Problem

Once the templates are selected, the iformat system constructs the lower levels of the IF tree. The templates form the upper level of the tree. For each of the operation groups in a template, the system extracts the inputs and outputs for each operation based on their I/O formats in the abstract ISA specification and adds this information to the IF tree. Using the extracted I/O formats, the system enumerates the instruction fields for each of the operation groups associated with the templates. Next, it builds field conflicts, partitions instruction fields into superfields, and extracts bit width requirements.

Instruction Fields

As shown in FIG. 2, the instruction fields form the leaves of the if-tree. Each instruction field corresponds to a datapath control port such as register file read/write address ports, predicate and opcode ports of functional units, and selector ports of multiplexors. Each field reserves a certain number of instruction bits to control the corresponding control port.

The set-up module assigns each field to a control port by traversing the if tree to find the operation group associated with the field, and then extracting the functional unit assigned to the operation group in the datapath specification.

The following sub-sections describe various kinds of instruction fields.

Select fields. At each level of the if-tree that is an OR node, there is a select field that chooses among the various alternatives. The number of alternatives is given by the number of children, n, of the OR node in the if-tree. Assuming a simple binary encoding, the bit requirement of the select field is then $\log_2(n)$ bits.

Different select fields are used to control different aspects of the datapath. The root of the if-tree has a template select field that is routed directly to the instruction unit control logic in order to determine the template width. It also specifies where the supergroup select fields are positioned. Therefore, this field must be allocated at a fixed position within the instruction. Together with the template select fields, the select fields at super group and operation group levels determine how to interpret the remaining bits of the template and therefore are routed to the instruction decode logic for the datapath. The select fields at the level of field types (IO sets) are used to control the multiplexors and tristate drivers at the input and output ports of the individual functional units to which that operation group is mapped. These fields select among the various register and literal file alternatives for each source or destination operand.

Register address fields. The read/write ports of various register files in the datapath need to be provided address bits to select the register to be read or written. The number of bits needed for these fields depends on the number of registers in the corresponding register file.

Literal fields. Some operation formats specify an immediate literal operand that is encoded within the instruction. The width of these literals is specified externally in the ArchSpec. Dense ranges of integer literals may be represented directly within the literal field, for example, an integer range of −512 to 511 requires a 10-bit literal field in 2's complement representation. On the other hand, a few individual program constants, such as 3.14159, may be encoded in a ROM or a PLA table whose address encoding is then provided in the literal field. In either case, the exact set of literals and their encodings must be specified in the ArchSpec.

Opcode fields. The opcode field bits are used to provide the opcodes to the functional unit to which an operation group is assigned. It is possible to use the internal hardware encoding of opcodes in the functional unit directly as the encoding of the opcode field, in which case the width of the opcode field is the same as the width of the opcode port of the corresponding functional unit and the bits are steered directly to it. This mechanism may be used when all the opcodes supported by a functional unit are present in the same operation group or the same super group.

Under some templates, however, the functional unit assigned to a given operation group may have many more opcodes than those present within the operation group. In this case, opcode field bits may be saved by encoding the hardware opcodes in a smaller set of bits determined by the number of opcodes in that operation group and then decoding these bits before supplying to the functional unit. In this case, the template and opgroup specifier bits are used to provide the context for the decoding logic.

Miscellaneous control fields. Some additional control fields are present at the instruction level that help in proper sequencing of instructions. These consists of the consume to end-of-packet bit and the field that encodes the number of no-op cycles following the current instruction.

Computing Field Conflicts

Before performing graph coloring, the system computes the pairwise conflict relation between instruction fields, which are represented as an undirected conflict graph.

In the if-tree, two leaf nodes (instruction fields) conflict if and only if their least-common ancestor is an AND node. The system computes pairwise conflict relations using a bottom-up data flow analysis of the if-tree. The procedure in the implementation maintains a field set, F, and a conflict relation, R. Set $F_n$ is the set of instruction fields in the subtree rooted at node n. Relation $R_n$ is the conflict relation for the subtree rooted at node n.

The procedure processes nodes in bottom-up order as follows: leaf node: At a leaf node, /, the field set is initialized to contain the leaf node, and the conflict relation is empty.

or-node: At an OR-node, the field set is the union of field sets for the node's children. Since an OR-node creates no new conflicts between fields, the conflict set is the union of conflict sets for the node's children.

and-node: At an AND-node, the field set is the union of field sets for the node's children. An AND-node creates a new conflict between any pair of fields for which this node is the least-common ancestor; i.e. there is a new conflict between any two fields that come from distinct subtrees of the AND-node. Formally, $$C_n = \bigcup_{i \in succ} C_i \cup \{(x, y) | x \in C_j, y \in C_k, j \neq k\}$$

This method can be implemented very efficiently, by noting that the sets can be implemented as linked lists. Because the field sets are guaranteed to be disjoint, each union can be performed in constant time by simply linking the children's lists (each union is charged to the child). Similarly, the initial union of children's conflict sets can be done in constant time (charged to each child). Finally, forming the cross-product conflicts between fields of distinct and-node children can be done in time proportional to the number of conflicts. Since each conflict is considered only once, the total cost is equal to the total number of conflicts, which is at most $n^2$. For an if-tree with n nodes and E conflicts, the overall complexity is O(n+E) time.

Assigning Field Affinities

As introduced above, the iformat system is capable of aligning instruction fields that correspond to the same control port to the same bit position in a process called affinity allocation. Such alignment may simplify the multiplexing and decoding logic required to control the corresponding datapath control ports since the same instruction bits are used under different templates. On the other hand, such alignment may waste some bits in the template thereby increasing its width.

In order to make use of affinity allocation, the set-up module groups instruction fields that point to the same datapath control port into a superfield. All instruction fields within a superfield are guaranteed not to conflict with each other since they use the same hardware resource and therefore must be mutually exclusive.

The superfield partitioning only identifies instruction fields that should preferably share instruction bits. However, sometimes it is deemed essential that certain instruction fields must share the same bits. For example, if the address bits of a register read port are aligned to the same bit positions under all templates, then these address bits may be steered directly from the instruction register to the register file without requiring any control logic to select the right set of bits. This forced sharing of bit positions can avoid the need for a multiplexor in the critical path of reading operands out of a register file, thereby enhancing performance.

To handle such a constraint, the iformat system allows a user or other program module to specify a subset of fields within a superfield that must share bits. One way to specify this is in the form of a level mask that identifies the levels of the if-tree below which all instruction fields that are in the same superfield must share bit positions. This mask is a parameter to the bit allocation process described in the next section.

Resource Allocation

Once the instruction fields have been assigned to the leaves and the pairwise conflicts have been determined, we are ready to begin allocating-bit positions to the instruction fields. In this problem, instruction fields are thought of as resource requesters. Bit positions in the instruction format are resources, which may be reused by mutually exclusive instruction fields. Fields required concurrently in an instruction must be allocated different bit positions, and are said to conflict. The resource allocation problem is to assign resources to requesters using a minimum number of resources, while guaranteeing that conflicting requestors are assigned different resources. The current implementation of resource allocation uses a variation of graph coloring.

Once the if-tree and instruction field conflict graph are built, the iformat system can allocate bit positions in the instruction format to instruction fields. Pseudocode for the resource allocation is shown below:

ResourceAlloc(nodeRequests, conflictGraph)
  // compute resource request for each node+neighbors
  foreach (node ∈ conflictGraph)
    Mark(node)=FALSE;
    TotalRequest(node)=Request(node)+
    Request(NeighborsOf(node));
  // sort nodes by increasing remaining total resource request
  // compute upper-bound on resources needed by allocation
  resNeeded=0; Stack=EMPTY;
  for (k from 0 to NumNodes(conflictGraph))
    find (minNode ∈ unmarked nodes) such that
    TotalRequest (minNode) is minimum;
    Mark(minNode)=TRUE;
    push(minNode,Stack);
    resNeeded=max(resNeeded, TotalRequest(minNode));
    foreach (nhbr ∈ NeighborsOf(minNode))
      TotalRequest(nhbr)−=Request (minNode);
  // process nodes in reverse order (i.e., decreasing total request)
  while (Stack is not EMPTY)
    node=pop(Stack);
    AllResources={0 . . . resNeeded-1};
    // available bits are those not already allocated to any neighbor
    AvailableRes(node)=AllResources−
    AllocatedRes(NeighborsOf(node));
    // select requested number of bits from available positions
    // according to one of several heuristics
    AllocatedRes(node)=Choose Request(node) resources from
    AvailableRes(node)
      ☒H1: Contiguous Allocation
      ☒H2: Affinity Allocation
  return resNeeded The allocation heuristic is a variant of Chaitin's graph coloring register allocation heuristic. See G. J. Chaitin, "Register Allocation and Spilling Via Graph Coloring", In Proceedings of the 1982 SIGPLAN Symposium on Compiler Construction, pp. 98–105, Boston, Mass., Jun. 23–25, 1982, Published as ACM SIGPLAN Notices 17(6). Chaitin made the following observation. Suppose G is a conflict graph to be colored using k colors. Let n be any node in G having fewer than k neighbors, and let G' be the graph formed from G by removing node n. Now suppose there is a valid k-coloring of G'. This coloring can be extended to form a valid k-coloring of G by simply assigning to n one of the k colors not used by any neighbor of n; an unused color is guaranteed to exist since n has fewer than k neighbors. Stated another way, a node and its w neighbors can be colored with w+1 or fewer colors.

This formulation differs from Chaitin's in two ways: first, we are trying to minimize the number of required colors (the number of bit positions needed to encode the instruction format), rather than trying to find a coloring within a hard limit; and second, the graph nodes have varying integer resource requirements (bit width requirements). The reduction rule is generalized to non-unit resource requests by summing the resource requests of a node and its neighbors. In the above pseudocode, the total resource request for a node and its neighbors is computed by the first loop. The heuristic repeatedly reduces the graph by eliminating the node with the current lowest total resource request (node plus remaining neighbors). At each reduction step, we keep track of the worst-case resource limit needed to extend the coloring. If the minimum total resources required exceed the current value of k, we increase k so that the reduction process can continue. The graph reduction is performed by the second loop. Nodes are pushed onto a stack as they are removed from the graph. Once the graph is reduced to a single node, we begin allocating bit positions (resources) to nodes. Nodes are processed in stack order, i.e. reverse reduction order. At each step, a node is popped from the stack and added to the current conflict graph so that it conflicts with any neighbor from the original graph that is present in the current conflict graph. The existing allocation is extended by assigning bit positions to satisfy the current node's request, using bit positions disjoint from bit positions assigned to the current node's neighbors.

Allocation heuristics

During bit allocation, the current node's request can be satisfied using any bit positions disjoint from positions allocated to the node's neighbors in the current conflict graph. The current implementation applies several heuristics to guide the selection of bits.

Left-most allocation. The number of required bit positions computed during graph reduction is the number needed to guarantee an allocation. In practice, the final allocation often uses fewer bits. By allocating requested bits using the left-most available positions, we can often achieve a shorter instruction format.

Contiguous allocation. Since bit positions requested by an instruction field generally flow to a common control point in the data path, we can simplify the interconnect layout by allocating requested bits to contiguous positions.

Affinity allocation. Non-conflicting instruction fields may have affinity, meaning there is an advantage to assigning them the same bit positions. For example, consider two non-conflicting fields that map to the same register file read address port. By assigning a single set of bit positions to the two fields, we reduce the interconnect complexity and avoid muxing at the read address port. As discussed earlier, each node has a set of affinity siblings. During allocation, we attempt to allocate the same bit positions to affinity siblings. This heuristic works as follows. When a node is first allocated, its allocation is also tentatively assigned to the node's affinity siblings. When a tentatively allocated node is processed, we make the tentative allocation permanent provided it does not conflict with the node's neighbors' allocations. If the tentative allocation fails, we allocate available bits to the current node using the previous heuristics, and we then attempt to re-allocate all previously allocated affinity siblings to make use of the current node's allocated bits. Because nodes are processed in decreasing order of conflict, tentative allocations often succeed.

A heuristics diagram for the resource allocation is as follows:

if node is tentatively allocated then
   make tentative allocation permanent, if possible
if node is (still) not allocated then
   try to use a sibling allocation
if node is (still) not allocated then {
   allocate either contiguously, or left-most available
   for each sibling of node {
     if sibling is allocated then
       try to use node's allocation in place of existing allocation
     else
       tentatively allocate sibling, using node's allocation
   } // for
}

Template-based Assembly

Once the complete structure of the instruction templates has been determined, we can proceed to assemble the code. All subsequent discussion is essentially to improve the quality of the templates. In this section, we briefly outline the process of assembly with a given set of templates.

A program that has been scheduled and register-allocated consists of a sequence of operations each of which has been assigned a time of issue. Multiple operations scheduled within the same cycle need to be assembled into a single instruction. Any instruction template that covers all the operations of an instruction may be used to assemble that instruction. Clearly, the shortest template is preferred to avoid increasing the codesize unnecessarily since longer templates would have to be filled with noops in the slots for which there are no operations in the current instruction.

The process of template selection for an instruction has the following steps. First, the specific compiler-opcode of each scheduled operation in the instruction is mapped back to its operation group. Each operation group keeps a record of the set of templates that it can be a part of. Finally, the intersection of all such sets corresponding to the operation groups present in the current instruction gives the set of templates that may be used to encode the current instruction. The shortest template from this set is chosen for assembly. The exact opcode and register bits are determined by mapping the compiler mnemonics to their machine encodings by consulting the if-tree.

Design of Application-specific Instruction Formats

As discussed above, the initial design produces a minimal set of maximally concurrent instruction templates that cover all possible concurrency relations implied by the ArchSpec. In practice, this tends to produce a few long templates since the processor designs we are interested in have quite a bit of expressible instruction-level parallelism (ILP). But not all that parallelism is used at all times by the scheduler. If we assemble programs using only these long templates, a lot of noops would have to be inserted in the low ILP parts of the code.

One fix to this problem is to customize the templates to the program being compiled. There are several aspects to such customization:

(1) Identify the most frequently used combinations of operations in the program and design shorter templates for them which allow fewer concurrent operations in them. An extension of this view also takes into account the most frequently used operation formats and creates new opgroups that incorporate just those.

(2) Use variable length encoding wherever there is a need to select one out of many choices in the instruction format. We may use variable length template selection bits according to the frequency of use of each template. Likewise, different operation groups within a slot and different opcodes within an operation group may be given a variable length encoding according to their frequency of use. There is, of course, a tradeoff between the codesize reduction and the increase in decode complexity.

(3) Sometimes, the decode complexity may be improved dramatically by doing affinity-based allocation of similar instruction fields across templates. This reduces the degree of multiplexing needed to route the same information represented at different positions in different templates. This amounts to reordering the positions of various operation groups within these templates.

(4) The instruction fetch and decode hardware is usually designed with a certain quantum of instruction information in mind. A quantum is a unit of data (e.g., an integer multiple of bytes) used to specify the width of the data path in the instruction fetch and decode hardware. Rounding the instruction templates up to the next quantum usually frees up extra bit space. One or more of the above strategies can then take advantage of this extra bit space without increasing the width of the instruction.

Schedule-based Template Customization

The instruction format information is not needed until the program is ready to be assembled. The compiler is driven by a machine-description that only depends on the specified ArchSpec and the structure of the datapath. This implies that the exact schedule of the program may be used to customize the various available templates. To customize templates for a particular application program, the iformat system uses operation issue statistics from a scheduled version of the program to determine the frequency of use of the various combinations of operations. It then selects frequently used combinations of operations as possible candidates for new templates. Finally, it performs a cost/benefit analysis to select new "custom" templates.

Figure 7:
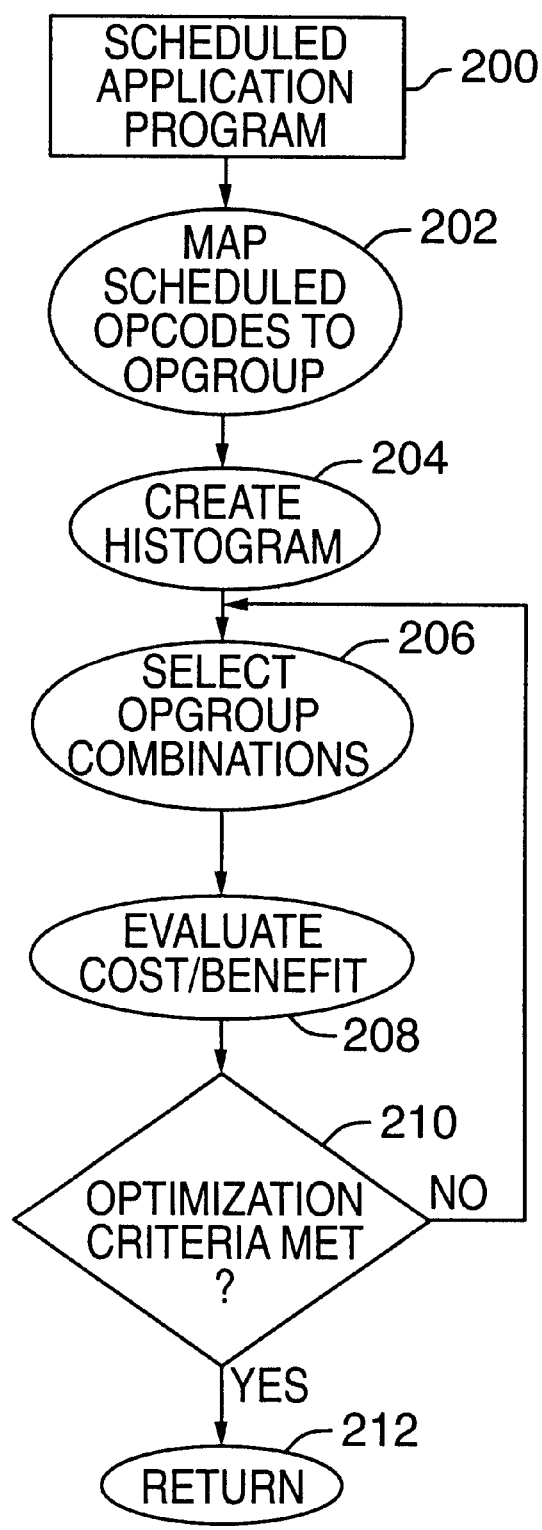
FIG. 7 is a flow diagram illustrating a process of selecting custom instruction templates from operation issue statistics generated from a compiler.

FIG. 7 is a flow diagram illustrating a process of selecting custom templates from operation issue statistics. The process begins by extracting usage statistics from a scheduled application program 200. This is done by mapping the scheduled opcodes of an instruction back to their operation groups as shown in step 202. The process then generates a histogram of combinations of operation groups from the program as shown in step 204.

A static histogram records the frequency of static occurrences of each combination within the program and may be used to optimize the static codesize. A dynamic histogram weights each operation group combination with its dynamic execution frequency and may be used to improve the instruction cache performance by giving preference to the most frequently executed sections of the code. One implementation uses the static histogram in the optimization to give preference to the overall static code size. In alternative implementations, the dynamic histogram or both the dynamic and static histograms may be used to optimize the dynamic code size of the combined dynamic/static code size, respectively.

Based on the frequency of use data in the histogram, the customization process selects combinations of opgroups as potential candidates for templates (206) and evaluates their cost/benefit (208) in terms of code size/decode complexity, which is quantified in a cost function. The process iteratively selects a set of templates, evaluates their cost/benefit, and ultimately returns a set of custom templates that meet a predetermined optimization criteria (210, 212). As noted above, the criteria may include, for example, a minimized static or dynamic code size or a minimized code size and decode complexity. An example of this criteria is discussed below.

In the current implementation, the problem of determining custom templates is formulated as follows. Let us assume that $T_1, \ldots, T_n$ are the instruction templates that are required to conform with the ArchSpec. Suppose $C_1, \ldots, C_m$ are distinct combinations of operation groups occurring in the program. Let the width of each combination be $w_i$ and its frequency of occurrence be $f_i$. Also, in case of unoptimized assembly, suppose each combination $C_i$ maps to an initial template $T_i$ with width $v_i$. Assuming that variable length encoding is not used for the template selection field, the initial size of the program is, $$W = \sum_{i=1}^{m} f_i \cdot (v_i + \lceil \log_2 n \rceil)$$

Now suppose we include $C_i$ as a custom template. This is taken to be in addition to the initial set of templates since those must be retained to cover other possible concurrency relations of the machine as specified in the ArchSpec. The additional template has a smaller width $w_i$ but it increases the size of the template selection field (and hence the decode logic). The other significant increase in decode cost is due to the fact that now the same operation may be represented in two different ways in the instruction format and hence the instruction bits from these two positions would have to be multiplexed based on the template selected. This cost may be partially or completely reduced by performing affinity allocation as discussed above.

If $X_i$ represents a 1/0 variable denoting whether combination $C_i$ is included or not, the optimized length of the program is denoted by, $$W_{cust} = \sum_{i=1}^{m} f_i \cdot (X_i \cdot w_i + (1 - X_i) \cdot v_i + \lceil \log_2(n + \sum X_i) \rceil)$$

$$= \sum_{i=1}^{m} f_i \cdot (v_i - X_i \cdot (v_i - w_i) + \lceil \log_2(n + \sum X_i) \rceil)$$

It is clear that we should customize all those operation group combinations into additional templates that provide the largest weighted benefit until the cost of encoding additional templates and their decoding cost outweigh the total benefits. One possible strategy is to pick the k most beneficial combinations where k is a small fixed number (e.g. k<16). The decode complexity directly impacts chip area needed for decode logic. With an increase in the number of templates, the complexity of the decode logic tends to grow, unless affinity constraints are used to align operation group occurrences from different templates to the same template slots. The chip area occupied by selection logic may be quantified as another component of the cost function.

Variable Length Field Encodings

Variable length field encoding is an important technique for reducing the overall instruction format bit length. The simplest use of variable length fields is in encoding a steering field that selects one of a set of exclusive fields of differing lengths. For example, the instruction formats have an opgroup steering field to select one of many opgroups available within a single issue slot. Suppose we have 32 opgroups available within a particular issue slot, and that the opgroups' encodings require lengths from 12 to 29 bits. With fixed-length encodings, we require an additional 5 bits to encode the opgroup selection, bringing the overall size of the issue slot to 34 bits. Using a variable-length encoding, we can allocate short encodings to opgroups having the greatest overall width, while using longer encodings for opgroups having smaller width. Provided there is enough "slack" in the shorter opgroups to accommodate longer encodings, the overall bit requirement can be reduced significantly. In our example, we may be able to achieve a 30 bit encoding for the issue slot.

One approach to designing variable-length encodings uses entropy coding, and in particular, a variant of Huffman encoding. Entropy coding is a coding technique typically used for data compression where an input symbol of some input length in bits is converted to a variable length code, with potentially a different length depending on the frequency of occurrence of the input symbol. Entropy coding assigns shorter codes to symbols that occur more frequently and assigns longer codes to less frequent codes such that the total space consumed of the coded symbols is less than that of the input symbols.

Let $\mathcal{F}$ be a set of exclusive bit fields, and let $w_i$ denote the bit length of field $i \in \mathcal{F}$. An encoding for the steering field for $\mathcal{F}$ is represented as a labeled binary tree, where each element of $\mathcal{F}$ is a tree leaf. The edge labels (zero or one) on the path from the root to a leaf i denotes the binary code for selecting i. A fixed-length steering code is represented by a balanced tree in which every leaf is at the same depth. Variable-length encodings are represented by asymmetric trees.

For a tree T representing a code for $\mathcal{F}$, we define $d_T(X)$ to be the depth of x, i.e., the code length for choice x. The total cost of encoding a choice x is the sum of the bit requirement for x and the code length for x:

$$\cos t_T(X) = d_T(X) + W(x)$$

The overall cost for encoding the set of fields $\mathcal{F}$ together with its steering field is equal to the worst-case single field cost:

$$C(T) = \max_{x \in \mathcal{J}} \{\cos t_T(x)\}$$

The goal is to find a code T of minimal cost. This problem is solved by the algorithm shown below:
Huffman (Set C, Weights W)
1: N=|C|;
2: //insert elements of C into priority queue
3: for X ∈ C do
4: enqueue (x, Q);
5: endif
6: for i=1 to n−1 do
7: z—new node;
8: x—extract_min (Q);
9: y—extract_min (Q);
10: z.left=x; z.right=y;
11: W(z)=max {W(x), W(y)}+1;
12: enqueue (z,Q);
13: endif
14: return extract_min (Q);

The coding algorithm works by constructing the code tree bottom-up, placing shorter fields deeper in the tree and longer fields closer to the root.
Extracting an Abstract ISA Specification from a Concrete ISA Specification As outlined above, the iformat design process may be used to generate an instruction format specification from a datapath specification and an abstract ISA specification. In an alternative design scenario, the iformat design process may be used to generate optimized concrete ISA specification programmatically from an initial concrete ISA specification and a list of frequently occurring combinations of operation group occurrences and ILP constraints. The initial concrete ISA specification includes an instruction format specification and a register file specification and mapping. The register file specification and mapping provides: 1) the register file types; 2) the number of registers in each file; and 3) a correspondence between each type of operand instruction field in the instruction format and a register file.

In order to optimize the instruction format in this scenario (and thereby the concrete ISA specification), the iformat design process programmatically extracts an abstract ISA specification from the concrete ISA specification (see step 54 in FIG. 1). It then proceeds to generate the bit allocation problem specification, and allocate bit positions programmatically as explained in detail above. The operation group occurrences and ILP constraints (e.g., concurrency sets of the operation group occurrences) may be provided as input from the user (e.g., starting with a custom template specification at block 56 in FIG. 1), or may be generated programmatically from operation issue statistics 68 in step 69 shown in FIG. 1 and described above.

Given a Concrete ISA Specification, this step extracts the information corresponding to an Abstract ISA Specification. The Instruction Format, which is part of the Concrete ISA Specification, consists of a set on Instruction Templates, each of which specifies sets of mutually exclusive opcodes that can be issued in parallel. From this information one can define the corresponding Operation Group Occurrences and a Concurrency Set consisting of these Operation Group Occurrences. All of the Instruction Templates, together, define the opcode repertoire, the Operation Groups and the ILP specification that form part of the Abstract ISA Specification. The Instruction Format Specification directly provides the I/O Format for each opcode as needed by the Abstract ISA Specification. The Register File Specification in the Concrete ISA Specification directly provides the Register File Specification that completes the Abstract ISA Specification.

CONCLUSION

The iformat design system detailed above provides an automated method of generating the bit position encodings for a VLIW instruction format based on an input specification of desired processor operations, the ILP among these operations, and a datapath representation. While the invention is described in the context of a specific implementation, the scope of the invention is not limited to this implementation. A number of design variations are possible.

For example, the methods for automating the instruction format design apply to fixed length VLIW instructions as well as variable length instructions. In the case of fixed-length instructions, the iformat design process generates multiple templates as in the case of variable-length instructions, but they all have roughly the same length. Dummy bit positions may be used to ensure that each instruction has the same length.

The implementation uses optimizations to simplify the selection of templates. One optimization is the way in which the system supports the grouping of operations having similar attributes. Another optimization is the automated partitioning of these groups into super groups to simplify the process of identifying sets of maximally concurrent operations. While these optimizations improve the efficiency of the implementation, they are not required for all implementations. Rather than partitioning opcodes into sets of mutually exclusive operations, they may be partitioned in alternative ways, or not at all.

The iformat process operates in part on a user specification of the operations and their ILP, and also in part on a datapath representation. The current implementation uses another automated process to generate the datapath representation from an input specification of the processor operations, the registers, and the ILP among the operations. However, it is also possible to perform the iformat design process using a datapath representation or concrete ISA specification provided by the user.

The resource allocation process of assigning bit positions in the processor control path to instruction fields may use a variety of heuristics to control the outcome of the allocation process. Preferably, a minimum number of bit positions should be allocated for the instruction fields. This is achieved by sharing bit positions among fields where possible based on the concurrency and resource sharing constraints. The implementation may force two fields to share bit positions by assigning a single instruction field to the nodes corresponding to these fields in the if tree. In addition, the implementation allows equivalent nodes to the have the same, different, or overlapping bit position allocations. The implementation uses the further heuristics of left-most allocation, contiguous allocation, and affinity allocation as explained above. However, the specific choice of heuristics can vary based on the design objectives of the implementation, such as simplifying the decode logic, minimizing static code size, minimizing dynamic code size to improve the performance of the processor's instruction cache, etc.

In view of the many possible implementations of the invention, it should be recognized that the implementation described above is only an example of the invention and should not be taken as a limitation on the scope of the invention. Rather, the scope of the invention is defined by the following claims. We therefore claim as our invention all that comes within the scope and spirit of these claims.

We claim:

1. A method for-programmatic design of a VLIW processor instruction format from an input specification including specified processor operations, instruction level parallelism constraints among the specified operations, and a datapath representation of the processor, the method comprising:

based on the specified processor operations, the instruction level parallelism constraints, and the datapath representation, programmatically constructing a bit allocation problem specification identifying instruction fields that are to be assigned to bit positions in the instruction format of the processor, bit width requirements of the instruction fields, and instruction field conflict constraints; and programmatically allocating bit positions in the processor to the instruction fields in the bit allocation problem specification.

2. The method of claim 1 wherein the instruction level parallelism constraints include concurrency sets representing sets of operations that can be issued in parallel for execution in the processor; and further including:

programmatically assigning VLIW instruction templates to the concurrency sets, where each template includes one or more slots, each slot is associated with operation groups that are to be issued concurrently with operation groups associated with another slot in the template.

3. The method of claim 2 further including:

programmatically partitioning operation groups into super groups of operation groups, where each operation group in a super group has common concurrency relationships as other operation groups in the super group and is mutually exclusive with respect to each of the other operation groups in the super group;

programmatically finding sets of super groups where each super group in a set is concurrent with every other super group in the set; and programmatically assigning a template to each set of super groups where each template represents bit position encodings of a VLIW instruction, each template has two or more contiguous slots of bit position encodings for concurrent operations, and each of the slots is associated with a super group assigned to the template.

4. The method of claim 1 further including:

programmatically generating an instruction format syntax tree, and:

the root node of the tree represents a VLIW instruction in a instruction format being computed;

child nodes of the root node comprise instruction templates;

child nodes of each instruction template comprise slots of the template and each slot is associated with a set of operation groups;

child sub-trees of each of the operation groups in each of the slots represent an input-output format of operations in the operation groups, including the instruction fields of the operations.

5. The method of claim 1 including:

programmatically extracting the bit width requirements of the instruction fields from the datapath representation.

6. The method of claim 1 including:

determining conflict relationships among the instruction fields in the data structure indicating which instruction fields must be allocated to different bit positions based on concurrency constraints; and using the conflict relationships to assign bit positions to each of the instruction fields so as to reduce total bit positions allocated to the instruction fields.

7. The method of claim 1 wherein allocating bit positions includes:

representing instruction fields that share a control port in the data path representation as having an affinity relationship; and attempting to allocate bit positions such that instruction fields that have an affinity relationship share bit positions.

8. The method of claim 1 wherein allocating bit positions includes:

allocating bit positions from a set of available bit positions that are arranged from left to right in the instruction format such that bits are allocated to left-most available bit positions of the set of available bit positions.

9. The method of claim 1 including:

reading custom templates; and programmatically constructing the bit allocation problem specification based in part on the custom templates.

10. A computer readable medium having programming modules for performing the method of claim 1.

11. A method for optimizing a VLIW processor instruction format from a concrete instruction set architecture specification including an instruction format specification, register file specification, and desired concurrency relationships among operation groups;

wherein the instruction format specification includes instructions, instruction fields within each of the instruction templates, and bit positions and encodings for the instruction fields; and wherein the register file specification includes register files having a specified number of registers, and a correspondence between operand instruction fields in the instruction format specification and a register file;

the method comprising:

programmatically extracting an abstract instruction set architecture specification including specified processor operations and instruction level parallelism constraints among the specified operations;

based on the abstract instruction set architecture, the desired concurrency relationships among operation groups, and the register file specification, programmatically constructing a bit allocation problem specification identifying instruction fields that are to be assigned to bit positions in the instruction format of the processor, bit width requirements of the instruction fields, and instruction field conflict constraints; and programmatically allocating bit positions in the processor to the instruction fields in the bit allocation problem specification.

12. A computer readable medium having programming modules for performing the method of claim 11.

13. A method for programmatic design of a VLIW processor instruction format, the method comprising:

in a computer readable data structure, providing a bit allocation problem specification including instruction fields that are to be assigned to bit positions in the instruction format of the processor, bit width requirements of the instruction fields, and instruction field conflict constraints; and programmatically allocating bit positions in the processor to the instruction fields in the bit allocation problem specification such that the instruction field conflict constraints are satisfied.

14. A computer readable medium having programming modules for performing the method of claim 13.

15. A method for programmatic design of a VLIW processor instruction format, the method comprising:

based on output from a re-targetable compiler, extracting usage statistics indicating frequency of use of processor operations in an application program; and based on the usage statistics, programmatically generating custom instruction templates for VLIW instructions that each include a combination of selected frequently used processor operations such that each instruction template specifies a set of operations that are allowed to be issued in parallel for execution in a VLIW processor.

16. A computer readable medium having programming modules for performing the method of claim 15.

17. The method of claim 15 further including:

selecting combinations of processor operations for each custom instruction template so as to minimize code size of the application program.

18. A method for programmatic design of a VLIW processor instruction format from an input specification including specified processor operations, instruction level parallelism constraints among the specified operations, and a datapath representation of the processor, the method comprising:

programmatically reading the input specification of the specified processor operations, the instruction level parallelism constraints, and the datapath representation; and based on the input specification, programmatically constructing a bit allocation problem specification for VLIW processor instructions identifying instruction fields in the VLIW processor instructions that are to be assigned to bit positions in the instruction format of the processor, bit width requirements of the instruction fields, and instruction field conflict constraints.

19. A computer readable medium having programming modules for performing the method of claim 18.

20. The method of claim 18 wherein the input specification includes custom templates, where each custom instruction template specifies a set of operations that are allowed to be issued in parallel for execution in a VLIW processor.

* * * * *